(12) United States Patent
Kim et al.

(10) Patent No.: US 11,251,294 B2
(45) Date of Patent: Feb. 15, 2022

(54) HIGH VOLTAGE BLOCKING III-V SEMICONDUCTOR DEVICE

(71) Applicant: Infineon Technologies Austria AG, Villach (AT)

(72) Inventors: Hyeongnam Kim, Chandler, AZ (US); Jens Ulrich Heinle, Villach (AT); Mohamed Imam, Chandler, AZ (US); Bhargav Pandya, Chandler, AZ (US); Ramakrishna Tadikonda, Torrance, CA (US); Manuel Vorwerk, Villach (AT)

(73) Assignee: Infineon Technologies Austria AG, Villach (AT)

( * ) Notice: Subject to any disclaimer, the term of this patent is extended or adjusted under 35 U.S.C. 154(b) by 28 days.

(21) Appl. No.: 16/828,104

(22) Filed: Mar. 24, 2020

(65) Prior Publication Data

US 2021/0305417 A1    Sep. 30, 2021

(51) Int. Cl.
*H01L 29/66* (2006.01)
*H01L 29/778* (2006.01)
*H01L 21/8252* (2006.01)
*H01L 27/088* (2006.01)

(52) U.S. Cl.
CPC ...... *H01L 29/7786* (2013.01); *H01L 21/8252* (2013.01); *H01L 27/088* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 2012/0098035 A1* | 4/2012 | Bahl | H01L 29/7787 257/194 |
| 2012/0153300 A1 | 6/2012 | Lidow et al. | |
| 2014/0021510 A1 | 1/2014 | Jeon et al. | |
| 2015/0371987 A1* | 12/2015 | Pan | H03K 17/6871 257/76 |
| 2016/0005845 A1* | 1/2016 | Kim | H01L 29/0657 257/194 |
| 2016/0293596 A1* | 10/2016 | Fareed | H01L 21/8252 |
| 2017/0148905 A1* | 5/2017 | Tipirneni | H01L 27/085 |
| 2017/0365702 A1 | 12/2017 | Prechtl et al. | |

(Continued)

*Primary Examiner* — Grant S Withers
(74) *Attorney, Agent, or Firm* — Murphy, Bilak & Homiller, PLLC

(57) ABSTRACT

A semiconductor device includes type IV semiconductor base substrate, first and second device areas that are electrically isolated from one another, a first region of type III-V semiconductor material formed over the first device area, a second region of type III-V semiconductor material formed over the second device area, the second region of type III-V semiconductor material being laterally electrically insulated from the first region of type III-V semiconductor material, a first high-electron mobility transistor integrally formed in the first region, and a second high-electron mobility transistor integrally formed in the second region. The first and second high-electron mobility transistors are connected in series. A source terminal of the first high-electron mobility transistor is electrically connected to the first device area. The first device area is electrically isolated from a subjacent intrinsically doped region of the base substrate by a first two-way voltage blocking device.

7 Claims, 17 Drawing Sheets

(56) References Cited

U.S. PATENT DOCUMENTS

| | | | | |
|---|---|---|---|---|
| 2018/0166339 A1* | 6/2018 | Hsueh | ................... | H01L 27/085 |
| 2018/0331156 A1* | 11/2018 | Then | ..................... | H01L 41/187 |
| 2018/0350933 A1* | 12/2018 | Huang | .............. | H01L 29/66462 |
| 2018/0350944 A1* | 12/2018 | Huang | ................ | H01L 21/8252 |
| 2019/0081039 A1* | 3/2019 | Siemieniec | ........... | H01L 29/205 |
| 2019/0326280 A1* | 10/2019 | Imam | ................. | H03K 17/6874 |
| 2020/0328296 A1* | 10/2020 | Hwang | ............. | H01L 29/66431 |

* cited by examiner

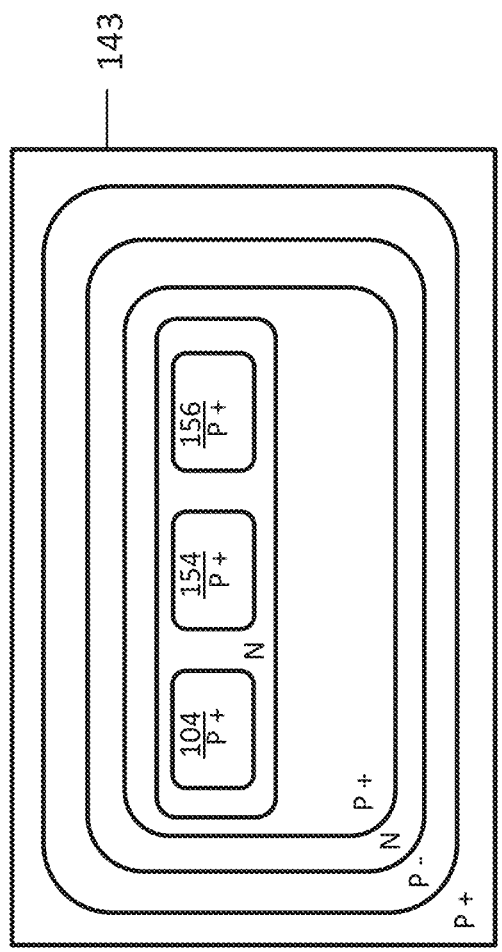
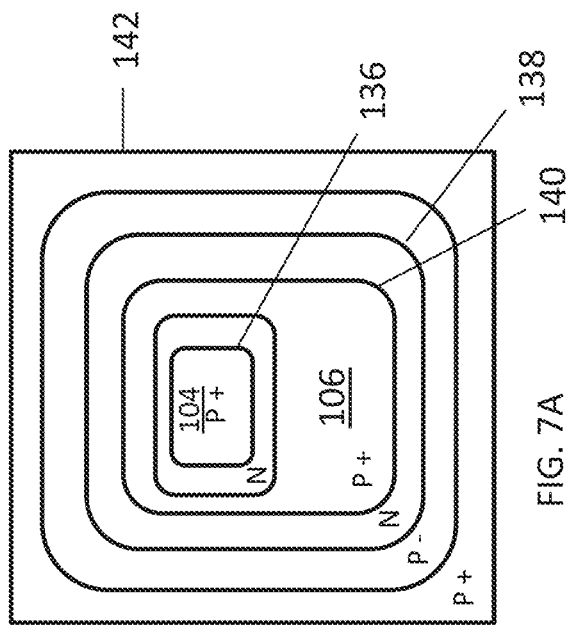
FIGURE 7

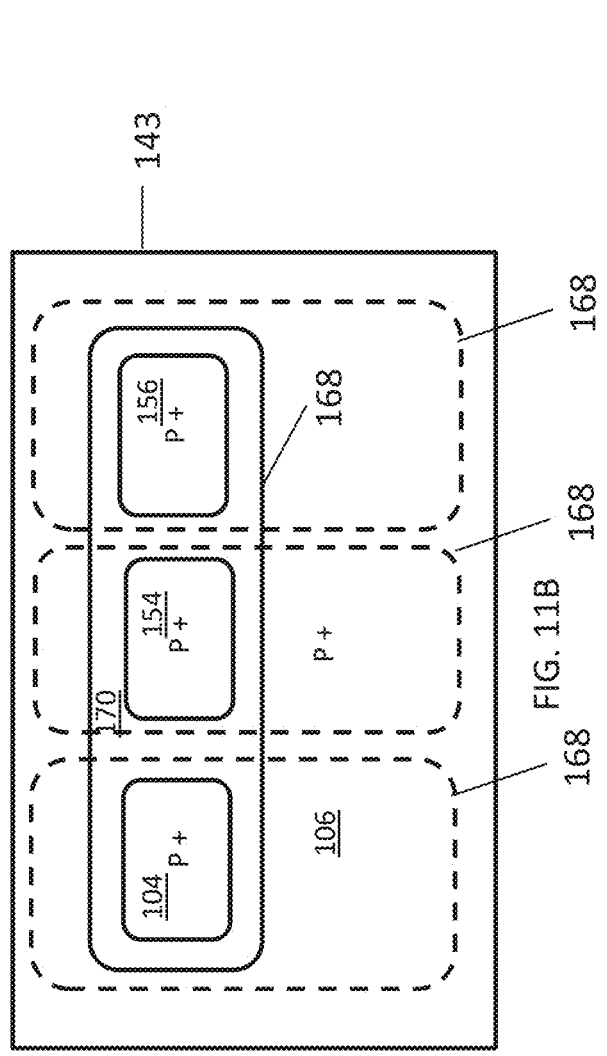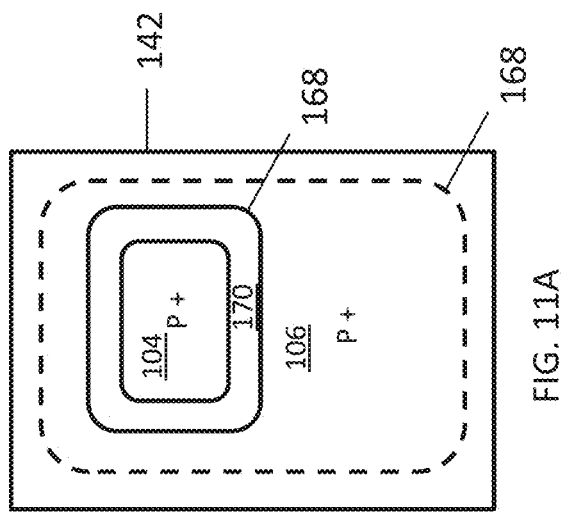
FIGURE 11

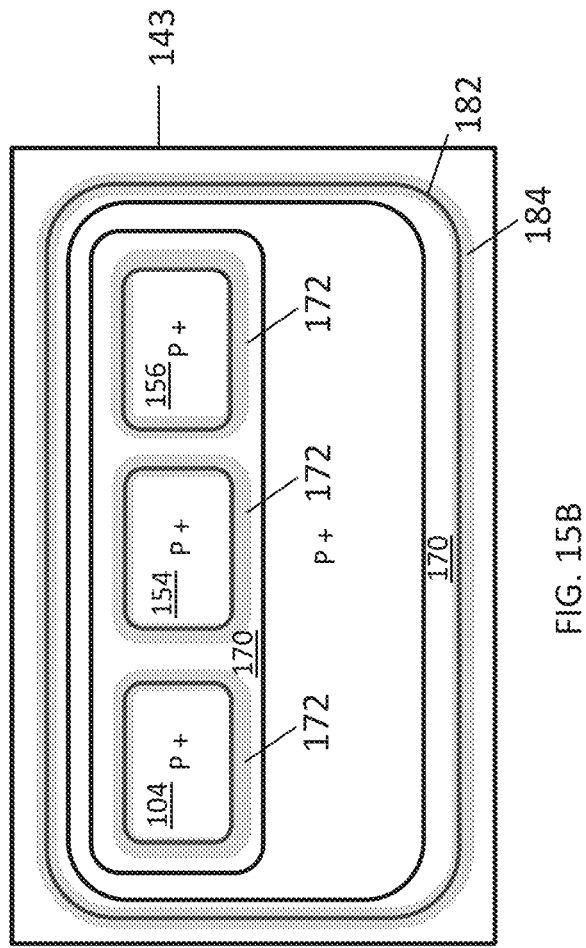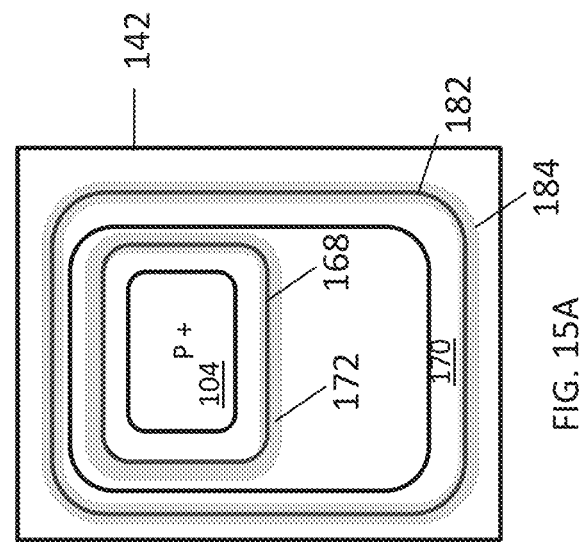
FIGURE 15

HIGH VOLTAGE BLOCKING III-V SEMICONDUCTOR DEVICE

TECHNICAL FIELD

The instant application relates to semiconductor devices, and in particular relates to high-electron-mobility devices formed in epitaxially grown type III-V semiconductor material.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a channel region formed by a heterojunction between two materials having different band gaps.

HEMTs are well suited for power switching applications, i.e., applications requiring the control of voltages in excess of 250V, 500V, 1000V, etc. or greater, and/or the control of current in excess of 1 A, 5 A, 10 A, etc. or greater, due to their high voltage blocking capability and low on-resistance. For example, HEMTs are a popular device type for power converters, e.g., AC to DC, DC to DC, etc. A common circuit topology in power converters is a half bridge circuit of two series connected switching devices. It is therefore desirable to monolithically integrate two or more HEMT devices in a single chip. In this way, the size and cost of the circuit can be reduced. However, one design challenge in this context relates to the interaction of two HEMT devices formed on a common substrate. Particularly at high voltages and/or high frequencies, the underlying substrate that accommodates the two HEMT devices may provide insufficient electrical isolation, which may cause device failure.

SUMMARY

A semiconductor device is disclosed. In an embodiment, the semiconductor device comprises a base substrate of type IV semiconductor material comprising a rear surface and an upper surface opposite the rear surface, first and second device areas that are electrically isolated from one another and each extend to the upper surface, a first region of type III-V semiconductor material formed on the base substrate over the first device area, a second region of type III-V semiconductor material formed on the base substrate over the second device area, the second region of type III-V semiconductor material being laterally electrically insulated from the first region of type III-V semiconductor material, a first high-electron mobility transistor integrally formed in the first region of type III-V semiconductor material, and a second high-electron mobility transistor integrally formed in the second region of type III-V semiconductor material. The first and second high-electron mobility transistors each comprise source and drain terminals and are each configured to control a conductive connection between the respective source and drain terminals. The first and second high-electron mobility transistors are connected in series with the source terminal of the first high-electron mobility transistor connected to the drain terminal of the second high-electron mobility transistor. The source terminal of the first high-electron mobility transistor is electrically connected to the first device area. The first device area is electrically isolated from a subjacent intrinsically doped region of the base substrate by a first two-way voltage blocking device.

Separately or in combination, the base substrate has an intrinsic dopant concentration of a first conductivity type, the first device area is a first doped region of the first conductivity type with a higher dopant concentration than the intrinsic dopant concentration, the semiconductor device further comprises a second doped region of a second conductivity type that is interposed between the first doped region and the subjacent intrinsically doped region, and the first two-way voltage blocking device is a pair opposing p-n junction diodes formed by the second doped region.

Separately or in combination, the semiconductor device further comprises third and fourth device areas that are each electrically isolated from the second device area and each extend to the upper surface, a third region of type III-V semiconductor material that is formed on the upper surface over the third device area and is laterally electrically insulated from the second region of type III-V semiconductor material, a fourth region of type III-V semiconductor material that is formed on the upper surface over the fourth device area and is laterally electrically insulated from the second region of type III-V semiconductor material, third and fourth high-electron mobility transistors integrally formed respectively in the third and fourth regions of type III-V semiconductor material, and fifth and sixth high-electron mobility transistors integrally formed respectively in the second region of type III-V semiconductor material, the third, fourth, fifth and sixth high-electron mobility transistors each comprise source and drain terminals and are configured to control a conductive connection between the respective source and drain terminals, the third and fifth high-electron mobility transistors are connected in series with the source of the third high-electron mobility transistor connected to the drain of the fifth high-electron mobility transistor, and the fourth and sixth high-electron mobility transistors are connected in series with the source of the fourth high-electron mobility transistor connected to the drain of the sixth high-electron mobility transistor.

Separately or in combination, the source terminal of the third high-electron mobility transistor is electrically connected to the third device area, the source terminal of the fourth high-electron mobility transistor is electrically connected to the fourth device area, wherein the third device area is electrically isolated from the subjacent intrinsically doped region of the base substrate by a second two-way voltage blocking device, and the fourth device area is electrically isolated from the subjacent intrinsically doped region of the base substrate by a third two-way voltage blocking device.

Separately or in combination, the second device area is a third doped region of the first conductivity type, and the second doped region is electrically isolated from the first doped region.

Separately or in combination, the first doped region is a first doped well that extends from the upper surface into the base substrate, wherein the second doped region at least laterally surrounds the first doped well.

Separately or in combination, the second doped region is a second doped well that extends from the upper surface into the base substrate, and the second doped well extends below the first well and laterally surrounds the second doped well.

Separately or in combination, the third doped region is a third doped well that extends from the upper surface into the base substrate, and the third doped well is formed in intrinsically doped semiconductor material of the base substrate.

Separately or in combination, the base substrate further comprises a first epitaxial layer of the second conductivity type that is disposed on an upper surface of the subjacent intrinsically doped region of the base substrate, and a second epitaxial layer of the first conductivity type that is disposed on the first epitaxial layer and extends to the upper surface of the base substrate. The first doped region is a section of the second epitaxial layer, and the second doped region is a section of the first epitaxial layer.

Separately or in combination, the semiconductor device further comprises an isolation trench that extends through the first and second epitaxial layers and reaches the subjacent intrinsically doped region of the base substrate, the isolation trench is laterally disposed between the first and second device areas, and the isolation trench is filled with an electrically insulating material.

Separately or in combination, the isolation trench fully surrounds the first and second doped regions.

Separately or in combination, the semiconductor device further comprises an electrically conductive field plate that is connected to the source terminal of the first high-electron mobility transistor, and the field plate comprises a first section that is substantially parallel to a sidewall of the isolation trench and a second section that is substantially parallel to a bottom of the isolation trench.

Separately or in combination, the second device area is electrically isolated from the subjacent intrinsically doped region of the base substrate by a fourth two-way voltage blocking device.

A method of forming a semiconductor device is disclosed. According to an embodiment, the method includes providing a base substrate of type IV semiconductor material comprising a rear surface and an upper surface opposite the rear surface, forming first and second device areas in the base substrate that are electrically isolated from one another and each extend to the upper surface, forming a first region of type III-V semiconductor material on the base substrate over the first device area; forming a second region of type III-V semiconductor material on the base substrate over the second device area, the second region of type III-V semiconductor material being laterally electrically insulated from the first region of type III-V semiconductor material, integrally forming a first high-electron mobility transistor in the first region of type III-V semiconductor material, integrally forming a second high-electron mobility transistor in the second region of type III-V semiconductor material, the first and second high-electron mobility transistors each comprising source and drain terminals and are each configured to control a conductive connection between the respective source and drain terminals, connecting the first and second high-electron mobility transistors in series with the source terminal of the first high-electron mobility transistor connected to the drain terminal of the second high-electron mobility transistor, connecting the source terminal of the first high-electron mobility transistor is electrically to the first device area, and forming a voltage blocking device that electrically isolates the first device area from a subjacent intrinsically doped region of the base substrate. The voltage blocking device is formed by no more than two masked dopant implantation steps.

Separately or in combination, the base substrate has an intrinsic dopant concentration of a first conductivity type, and forming the voltage blocking device comprises performing a first masked implantation step that forms a third doped well in an intrinsically doped region of the base substrate, the second doped well having a second conductivity type that is opposite the first conductivity type.

Separately or in combination, forming the voltage blocking device further comprises performing a second masked implantation step that forms a first doped well within the second doped well, the first doped well having the first conductivity type and having a higher dopant concentration than the intrinsically doped region, and the first and second masked implantation steps form a first two-way voltage blocking device that is interposed between the first device area and the subjacent intrinsically doped region.

In another embodiment, the method comprises providing a base substrate of type IV semiconductor material comprising a rear surface and an upper surface opposite the rear surface, forming first and second device areas in the base substrate that are electrically isolated from one another and each extend to the upper surface, forming a first region of type III-V semiconductor material on the base substrate over the first device area, forming a second region of type III-V semiconductor material on the base substrate over the second device area, the second region of type III-V semiconductor material being laterally electrically insulated from the first region of type III-V semiconductor material, and integrally forming a first high-electron mobility transistor in the first region of type III-V semiconductor material, integrally forming a second high-electron mobility transistor in the second region of type III-V semiconductor material, the first and second high-electron mobility transistors each comprising source and drain terminals and are each configured to control a conductive connection between the respective source and drain terminals, connecting the first and second high-electron mobility transistors in series with the source terminal of the first high-electron mobility transistor connected to the drain terminal of the second high-electron mobility transistor, connecting the source terminal of the first high-electron mobility transistor is electrically to the first device area, forming one or more epitaxial layers on an intrinsically doped region of the base substrate, and forming an isolation trench between the first and second device areas. The one or more epitaxial layers form a voltage blocking device that electrically isolates the first device area from the intrinsically doped region of the base substrate.

Separately or in combination, forming the one or more epitaxial layers comprises epitaxially forming a first epitaxial layer of a second conductivity type directly on the intrinsically doped region of the base substrate, the second conductivity type being opposite the first conductivity type, and the voltage blocking device comprises a second p-n junction diode between the first epitaxial layer and the intrinsically doped region of the base substrate.

Separately or in combination, forming the one or more epitaxial layers further comprises epitaxially forming a second epitaxial layer of the first conductivity type on the first epitaxial layer, the second epitaxial layer having a higher dopant concentration than the intrinsically doped region of the base substrate, and the voltage blocking device further comprises a first p-n junction diode between the first and second epitaxial layers.

Separately or in combination, the isolation trench is formed to extend through the first and second epitaxial layers, and the first device area is fully surrounded by the isolation trench.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 7, which includes FIGS. 7A and 7B, illustrates a plan-view perspective of the pre-engineered substrate configuration of FIG. 6, according to an embodiment. FIG. 7A depicts a single-phase implementation and FIG. 7B depicts a three-phase implementation.

FIG. 11, which includes FIGS. 11A and 11B, illustrates a plan-view perspective of the pre-engineered substrate configuration of FIG. 10, according to an embodiment. FIG. 11A depicts a single-phase implementation and FIG. 11B depicts a three-phase implementation.

FIGS. 12A and 12B, illustrates a plan-view perspective of the pre-engineered substrate configuration of FIG. 10, according to an embodiment. FIG. 12A depicts a single-phase implementation and FIG. 12B depicts a three-phase implementation.

FIG. 15, which includes FIGS. 15A and 15B, illustrates a plan-view perspective of the pre-engineered substrate configuration of FIG. 14, according to an embodiment. FIG. 15A depicts a single-phase implementation and FIG. 15B depicts a three-phase implementation.

DETAILED DESCRIPTION

According to embodiments described herein, a base substrate is pre-engineered to include first and second device areas on an upper surface of the base substrate, with at least the first device area being electrically isolated from the underlying substrate by a voltage blocking device. The voltage blocking device is integrally formed within the base substrate. Type III-V semiconductor material can be formed on the first device areas (e.g., by epitaxy), and high-electron-mobility devices can be formed therein. The first device area provides underlying substrate region for one of the high-electron-mobility devices that remains electrically isolated during high voltage and/or high frequency operation of a half-bridge circuit. Various advantageous techniques are described herein for providing the pre-engineered base substrate from a bulk semiconductor wafer (e.g., silicon wafer with a low p-type dopant concentration) with minimal processing steps. For example, one technique requires no more than two masked implantation steps to be performed on the bulk semiconductor wafer. In another example, the technique requires no more than two epitaxial deposition steps and no more than one trench formation step.

Figure 1:
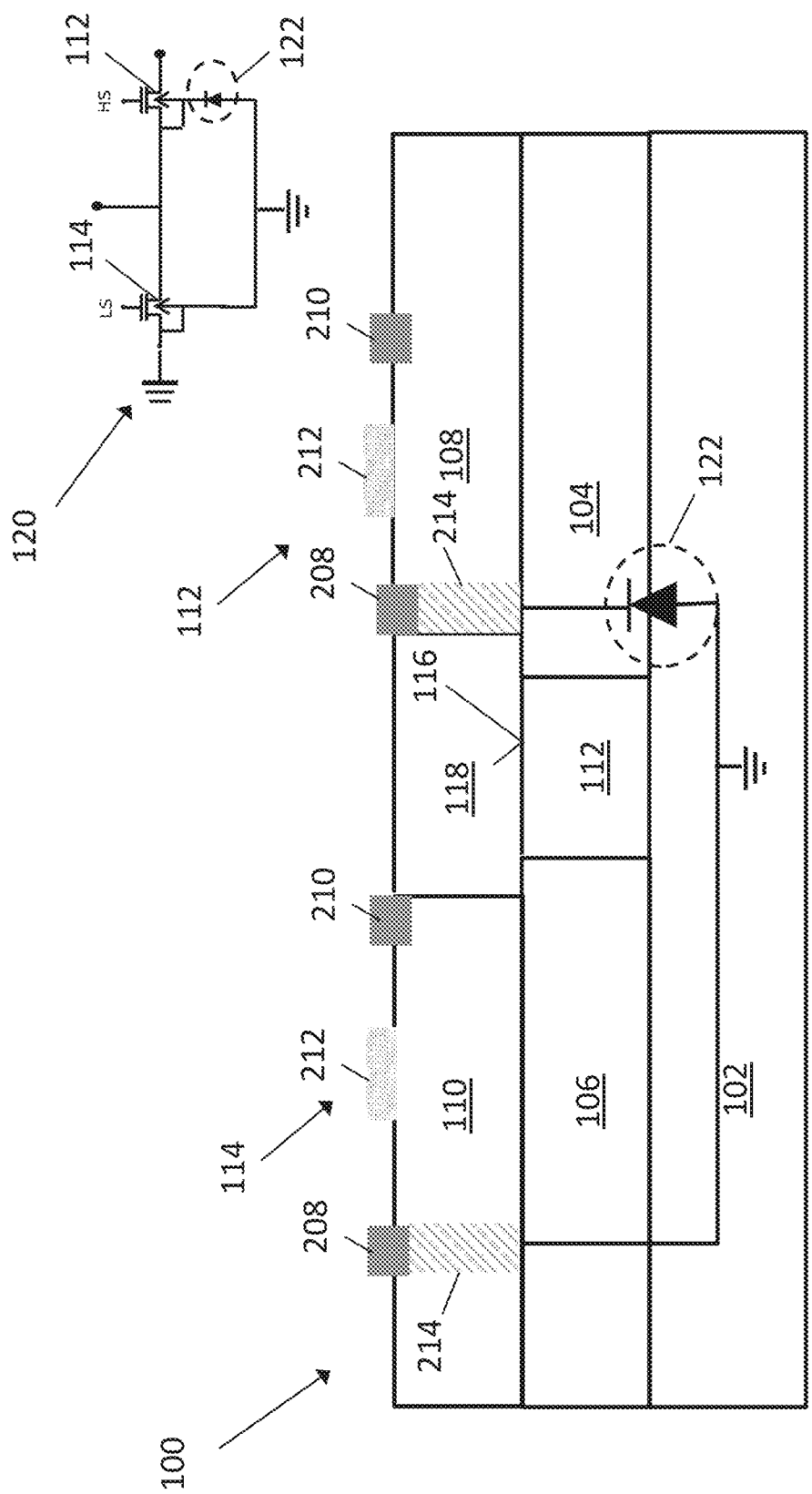
FIG. 1 illustrates a semiconductor device that includes high-electron-mobility field effect transistors formed on a pre-engineered substrate having electrically isolated device areas, according to an embodiment.

Referring to FIG. 1, a semiconductor device 100 is depicted, according to an embodiment. The semiconductor device 100 includes a base substrate 102, first and second device areas 104, 106, a first region of type III-V semiconductor material 108, a second region of type III-V semiconductor material 110, a first high-electron mobility transistor 112, and a second high-electron mobility transistor 114.

The base substrate 102 is configured to grow type III-V semiconductor material on an upper surface 116 of the base substrate 102. Generally speaking, the base substrate 102 can include any material that is suitable to this end. According to an embodiment, the base substrate 102 includes type IV semiconductor material, e.g., silicon (Si), silicon carbide (SiC) silicon germanium (SiGe), etc. The base substrate 102 can be provided from a commercially available bulk type IV semiconductor wafer. The base substrate 102 may have an intrinsic doping concentration. The intrinsic doping concentration refers to an underlying dopant concentration that exists in the semiconductor material without any intentional doping steps being performed. The intrinsic doping concentration of the base substrate 102 can vary from lightly doped to heavily doped, e.g., between $10^{13}$ dopant atoms/cm$^3$ to $10^{19}$ dopant atoms/cm$^3$. According to an embodiment, the base substrate 102 is a silicon substrate with a lightly doped (e.g., in the range of $10^{13}$-$10^{15}$ dopant atoms/cm$^3$) intrinsic doping concentration of a first conductivity type (e.g., p-type). Alternatively, the base substrate 102 may have a low doping concentration, wherein doping has been intentionally performed. The doping concentration may be below $10^{15}$ dopant atoms/cm$^3$ such as between $10^{13}$ and $10^{15}$ dopant atoms/cm$^3$. According to an embodiment, the base substrate may be a high ohmic substrate having resistivity of 10 Ohm*cm or more such as 50 Ohm*cm or more, preferably more than 75 Ohm*cm. The resistivity may be equal to or lower than 200 Ohm*cm.

The first and second device areas 104, 106 are laterally adjacent portions of the base substrate 102. As shown, the first and second device areas 104, 106 may be laterally separated from one another by an intervening region 112 of the substrate that is distinguishable from the first and second device areas 104, 106 in some way, e.g., conductivity type, material type, etc. According to an embodiment, the first and second device areas 104, 106 are laterally electrically isolated from one another by the intervening region 112. This means that an electrical barrier that prevents the flow of carriers is interposed between the two regions, e.g., a p-n junction or a dielectric material.

The first and second device areas 104, 106 each extend to the upper surface 116 of the base substrate 102. As will be illustrated in further detail below, the first and second device areas 104, 106 include a continuous area at the upper surface 116 of the base substrate 102 such that type III-V semiconductor material can be grown in these continuous areas.

The first and second regions of type III-V semiconductor material 108, 110 are formed on the upper surface 116 of the base substrate 102. Specifically, the first region of type III-V semiconductor material 108 is formed to partially or completely cover the first device area 104 and the second region of type III-V semiconductor material 110 is formed to partially or completely cover the second device area 106.

Generally speaking, the first and second regions of type III-V semiconductor material 108, 110 can include any material that is suitable for forming a heterojunction for power semiconductor devices. Exemplary type III-V semiconductor materials to this end include gallium nitride (GaN), gallium arsenide (GaAs), aluminium nitride (AlN), aluminium arsenide (AlAs), indium nitride (InN), indium arsenide (InAs), etc., and ternary or quarternary type III-V semiconductor materials such as aluminium gallium nitride (AlGaN), aluminium gallium arsenide (AlGaAs), indium gallium nitride (InGaN), indium aluminium nitride (InAlGaN), etc.

The first and second regions of type III-V semiconductor material 108, 110 can be formed on the upper surface 116 of the base substrate 102 by an epitaxial growth technique. To facilitate the epitaxy process, a nucleation layer (not shown) can be formed on the upper surface 116 of the base substrate 102. The nucleation layer can be a thin layer of nitride material, e.g., a 100-200 nm thick region of AlN (aluminum nitride).

The second region of type III-V semiconductor material 110 is laterally electrically insulated from the first region of type III-V semiconductor material 108. This means that an electrically insulating region 118 is provided over the base substrate 102 in the lateral space between the first and second regions of type III-V semiconductor material 108, 110 such that no direct connection of type III-V semiconductor material exists between the two regions. The electrically insulating region 118 may include dielectric material formed on the upper surface 116 of the base substrate 102, e.g., an oxide, a nitride, etc. Alternatively, the electrically insulating region 118 may be an air gap between the first and second regions of type III-V semiconductor material 108, 110.

Figure 2:
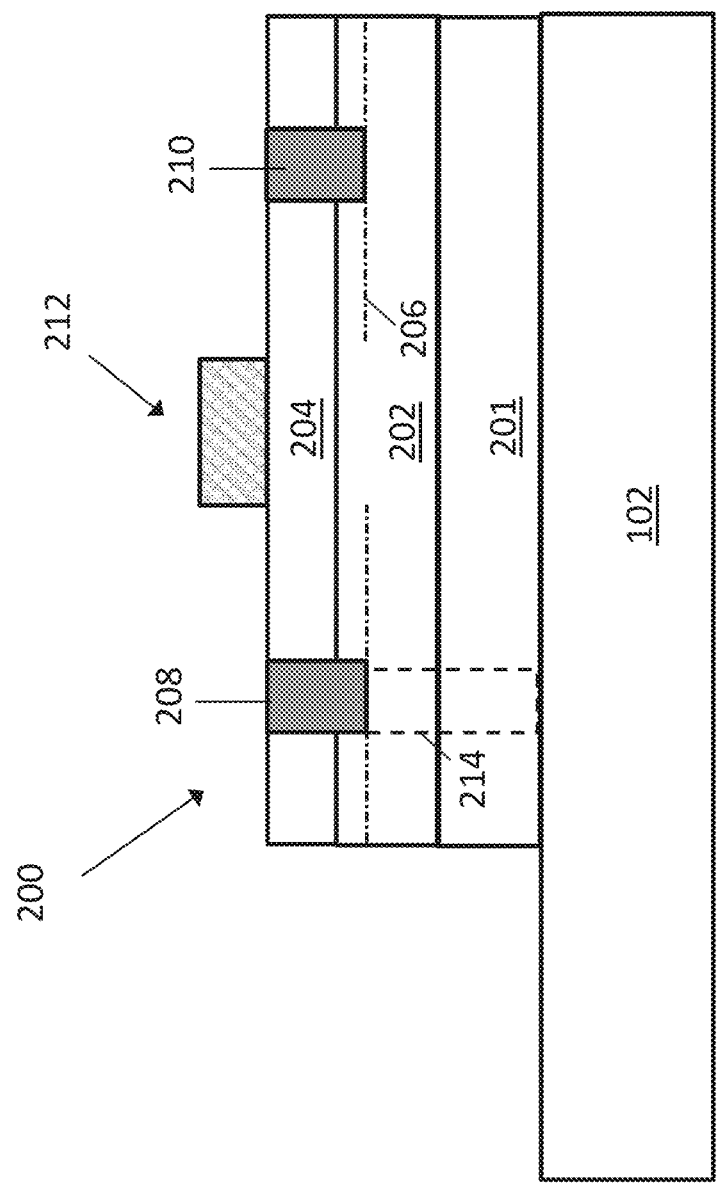
FIG. 2 illustrates a high-electron-mobility field effect transistor, according to an embodiment.

Referring to FIG. 2, a detailed view of a device 200 that can be integrally formed in the first or second regions of type III-V semiconductor material 108 or 110 is depicted, according to an embodiment. This device 200 has a high-electron mobility transistor configuration. The high-electron mobility transistor includes a channel layer 202 and a barrier layer 204 formed on the channel layer 202. The barrier layer 204 has a different bandgap as the channel layer 202. For example, the barrier layer 204 may be a layer of aluminum gallium nitride (AlGaN) and the channel layer 202 may be a layer of gallium nitride (GaN). Due to this difference in bandgap, a two-dimensional charge carrier gas, e.g., a two-dimensional electron gas (2DEG), intrinsically arises near the interface between the channel layer 202 and the barrier layer 204. This two-dimensional charge carrier gas forms a channel 206 of the high-electron mobility transistor. The high-electron mobility transistor additionally includes source and drain terminals, 208, 210 and a gate structure 212. In a commonly known manner, the high-electron mobility transistor is configured to control a conductive connection between the source and drain terminals 208, 210 through application of a gate-source potential. The high-electron mobility transistor can be a normally-on device, i.e., a device that is conductive at zero gate-source bias, or a normally-off device, i.e., a device that is non-conductive at zero gate-source bias.

The device 200 may include an additional region 201 between the channel layer 202 and the base substrate. The additional region 201 may include a nucleation layer or layers (e.g., a layer of AlN), a lattice transition region of type III-V semiconductor material that is configured to alleviate mechanical stress attributable to crystalline lattice mismatch between the type IV semiconductor material of the base substrate 102 and the type III-V semiconductor material of the channel layer 202, and type III-V semiconductor back barrier or buffer regions.

The device 200 may additionally include an electrically conductive substrate contact 214. The substrate contact 214 may extend to a bottom side of the type III-V semiconductor material so as to form a direct electrical connection with the upper surface 116 of the base substrate 102. According to an embodiment, the substrate contact 214 is electrically connected to the source terminal of the high-electron mobility transistor.

Referring again to FIG. 1, an electrical schematic of a half-bridge circuit 120 formed by the semiconductor device 100 is depicted, according to an embodiment. The half-bridge circuit 120 includes a first high-electron mobility transistor 112 that is integrally formed in the first region of type III-V semiconductor material 108 (e.g., in the manner described with reference to FIG. 2) and a second high-electron mobility transistor 114 that is integrally formed in the second region of type III-V semiconductor material 110 (e.g., in the manner described with reference to FIG. 2). The first and second high-electron mobility transistors 112, 114 are connected in series such that the source terminal of the first high-electron mobility transistor 112 is connected to the drain terminal of the second high-electron mobility transistor 114. The drain of the first high-electron mobility transistor 112 is electrically connected to a fixed voltage (e.g., 500V or more) and the source of the second high-electron mobility transistor 114 is connected to a reference potential (e.g., GND). The first high-electron mobility transistor 112 provides the high-side switch and the second high-electron mobility transistor 114 provides the low-side switch of the half-bridge circuit 120. The electrical connections may be effectuated using layers of metallization (not shown) over the first and second regions of type III-V semiconductor material 108, 110. The semiconductor device 100 may include conductive bond pads in or above these layers of metallization which provide a ground connection, a source connection, and an output connection of the circuit. In this way, the semiconductor device 100 may be configured as a discrete half-bridge device, wherein the high-side switch and low-side switch are monolithically integrated in a single chip of semiconductor material.

The inventors have observed failure mechanism in a monolithically integrated half-bridge circuit that is attributable to capacitive coupling to the substrate. A half-bridge circuit operates as a power converter by cycling the high-side and low-side switches between ON and OFF states, with one switch being turned OFF when the other is turned ON. Failure has been observed in a monolithically integrated half-bridge circuit biased at potentials over 200V with the high-side switch in an ON state and the low-side switch in an OFF state. In this condition, the difference between source voltage applied to the high-side switch and the voltage of substrate underneath the high-side switch can exceed 200 V. When this source-substrate voltage difference reaches these values, the high-side switch becomes less conductive. The reason for this failure is attributable to a back-gating effect wherein the substrate periodically charges and discharges through charge pumping. The issue is more pronounced at higher frequencies.

The embodiments described herein address the above described failure mechanism through the advantageous incorporation of a voltage blocking device 122 in the base substrate 102. The voltage blocking device 122 is configured to electrically isolate the first device area 104 from a subjacent intrinsically doped region of the base substrate 102. That is, the voltage blocking device 122 is configured to maintain a voltage difference between the first device area 104 and the underlying portion of the base substrate 102. By maintaining this voltage difference, the difference in source-substrate voltage of the high-electron mobility transistor can be held at acceptably low values. The source terminal of the first high-electron mobility transistor 112 can be tied to the voltage of the first device area 104 using the substrate contact 214. As the source potential of the high-side switch increases, the voltage blocking device 122 maintains a potential difference between the first device area 104 and the underlying base substrate 102, thereby keeping the first device region at least substantially close to the source potential.

In the embodiment of FIG. 1, the substrate contact 214 electrically connects the source terminal of the second high-electron mobility transistor 114 to the base substrate 102 via the second device area 106. This substrate contact 214 can be included in any one of the embodiments described herein such that the source terminal of the second high-electron mobility transistor 114 has the same substrate connection as the first high-electron mobility transistor 114. Alternatively, in each of the embodiments described herein, the substrate contact 214 connection with the source terminal of the second high-electron mobility transistor 114 can be omitted. In that case, the source terminal of the second high-electron mobility transistor 114 can be separately connected to a reference potential.

Advantageously, the embodiments described herein include methods for forming a pre-engineered base substrate 102 to include the electrically isolated first device area 104 with minimal processing steps. The pre-engineered base substrate 102 provides a usable semiconductor wafer for the formation of III-V semiconductor material thereon, with the voltage blocking device 122 already incorporated into the structure. Hence, when a high-electron mobility transistor is formed over the first device area 104 and the source-substrate connection is effectuated, the beneficial substrate voltage pairing is automatically obtained. Described below are various techniques for pre-engineering the base substrate 102 to include the first device region and the voltage blocking device 122 with the above described configuration.

In each of the embodiments, an electrical schematic of a half-bridge circuit 120 that may be formed using the pre-engineered base substrate 102 is depicted. This is not the only circuit configuration that is possible using the pre-engineered base substrate 102. The half-bridge circuit 120 of each embodiment includes a ground connection between the source terminals of the first and second high-electron mobility transistors 112, 114. This ground connection may be provided by a rear contact structure contacting the base substrate 102, for example. Alternatively, this ground connection between the first and second device area 104, 106 may be omitted in each of the embodiments. In either case, the source-substrate voltage difference of the high-side switch remains within acceptable levels during operation of the half-bridge circuit 120.

Figure 3:
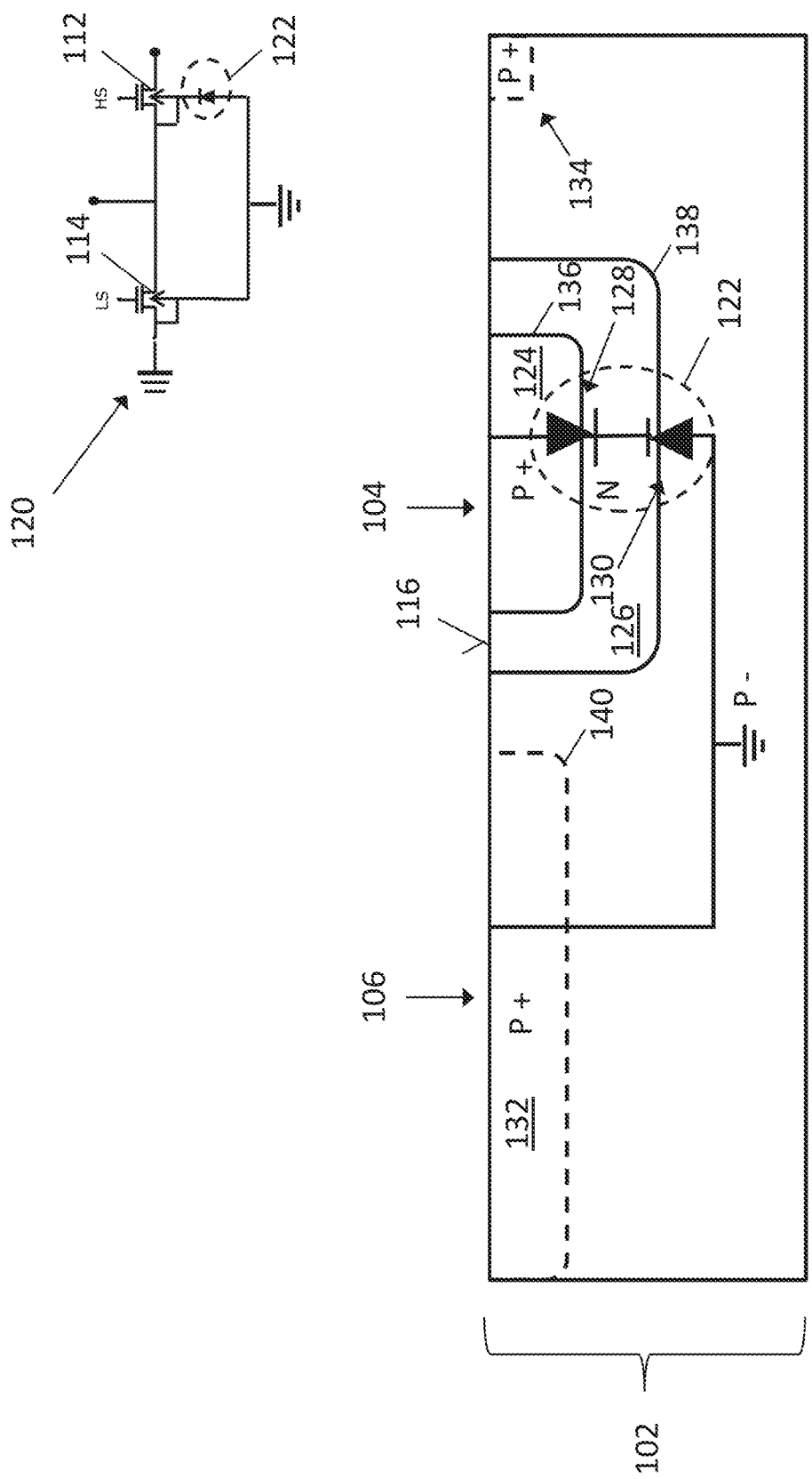
FIG. 3 illustrates a cross-sectional perspective of a pre-engineered substrate having electrically isolated device areas, according to an embodiment.

Referring to FIG. 3, a pre-engineered base substrate 102 is depicted, according to an embodiment. In this example, the base substrate 102 has an intrinsic dopant concentration of a first conductivity type (e.g., p-type). The first device area 104 is provided by a first doped region 124 which has a first conductivity type majority carrier concentration that is higher than the intrinsic dopant concentration. The base substrate 102 additionally includes a second doped region 126 of a second conductivity type (e.g., n-type). The second doped region 126 is interposed between the first doped region 124 and a subjacent intrinsically doped region of the base substrate 102. That is, the second doped region 126 separates the first doped region 124 from the intrinsically doped regions of the base substrate 102 beneath the first device area 104. In the depicted embodiment, the second doped region 126 completely laterally surrounds the first doped region 124, and hence provides a complete electrical isolation structure around the first doped region 124.

According to an embodiment, the intrinsic dopant concentration of the base substrate 102 is between $10^{13}$ dopant atoms/cm$^3$ and $10^{15}$ dopant atoms/cm$^3$, the dopant concentration of the first doped region 124 is between $10^{15}$ dopant atoms/cm$^3$ and $10^{19}$ dopant atoms/cm$^3$, and the dopant concentration of the second doped region 126 is between $10^{15}$ dopant atoms/cm$^3$ and $10^{16}$ dopant atoms/cm$^3$. In a more specific example, the intrinsic dopant concentration of the base substrate 102 is about $10^{14}$ dopant atoms/cm$^3$, the dopant concentration of the first doped region 124 is about $10^{15}$ dopant atoms/cm$^3$ and the dopant concentration of the second doped region 126 is about $10^{16}$ dopant atoms/cm$^3$.

The voltage blocking device 122 is formed in the base substrate 102 by the p-n junctions interposed between the first doped region 124 and the base substrate 102. A first p-n junction diode 128 is formed between the first doped region 124 and the second doped region 126, and a second p-n junction diode 130 is formed between the second doped region 126 and the intrinsically doped region of the base substrate 102. As a result, the voltage blocking device 122 in this embodiment is configured as a two-way voltage blocking device 122. That is, the voltage blocking device 122 is configured to prevent carrier flow in both directions. The second p-n junction diode 130 is configured to maintain a potential difference between the first device area 104 and the underlying base substrate 102 and hence provide the above described source-substrate voltage matching. The second p-n junction diode 130, which is arranged in an opposite polarity as the first p-n junction diode 128, hinders reverse recovery behavior of the device. Reverse recovery is a well-known phenomenon wherein charge carriers must be removed from a p-n junction before it can enter a voltage blocking state. When the first high-electron mobility transistor 112 switches from OFF to ON, the first p-n junction diode 128 enters a reverse recovery state. This produces a current in the first p-n junction diode 128, which is added to the current flowing through the first high-electron mobility transistor 112 and causes non-ideal switching behavior. As the second p-n junction diode 130 is arranged with the opposite polarity, it prevents this reverse recovery current from flowing.

According to an embodiment, the second device area 106 is provided by a third doped region 132 which has a first conductivity type majority carrier concentration that is higher than the intrinsic dopant concentration. The third doped region 132 may have the same or substantially similar dopant concentration as the first doped region 124. Alternatively, the second device area 106 can be an intrinsically doped region of the base substrate 102 that is laterally adjacent to the first device area 104.

According to an embodiment, the base substrate 102 additionally includes an edge termination region 134 which has a first conductivity type majority carrier concentration that is higher than the intrinsic dopant concentration. The edge termination region 134 may have the same or substantially similar dopant concentration as the third doped region 132. The edge termination region 134 prevents large voltage gradients at the edge side of the base substrate 102, thereby improving the breakdown voltage of the device.

In the embodiment of FIG. 3, each of the first, second and third doped regions 124, 126 and 132 are provided by doped wells formed in the upper surface 116 of the base substrate 102. Specifically, the first doped region 124 is provided by a first doped well 136 that extends from the upper surface 116 into the base substrate 102, the second doped region 126 is provided by a second doped well 138 that extends from the upper surface 116 into the base substrate 102, and the third doped region 132 is provided by a third doped well 140 that extends from the upper surface 116 into the base substrate 102. The first and second doped wells 136, 138 are formed such that the second doped well 138 fully surrounds the first doped well 136. That is, the first doped well 136 is formed inside of the second doped well 138 such that the first doped well 136 does not contact any intrinsically doped region of the base substrate 102. As a result, the first doped well 136 is fully electrically isolated from the substrate by the two-way voltage blocking device 122.

Advantageously, the pre-engineered base substrate 102 can be made starting with a bulk semiconductor wafer and performing no more than two masked dopant implantation steps. As a result, the substrate may be pre-engineered with the advantageous voltage blocking arrangement at minimal expense. For example, in an embodiment, the pre-engineered base substrate 102 is formed by first and second masked implantation steps. After providing a bulk semiconductor wafer, the first masked implantation step is performed to form the second doped well 138 by implanting second conductivity type dopants into the upper surface 116 of the base substrate 102. Subsequently, the second masked implantation step is performed to form the first and third doped wells 136, 140, and the edge termination region 134 by implanting first conductivity type dopants into the upper surface 116 of the base substrate 102. In both steps, a patterned mask (e.g., a hardmask or a photomask) is provided on the upper surface 116 of the base substrate 102 and dopants (e.g., Boron, Phosphorus, etc.) are introduced through the openings in the mask. Subsequent annealing steps may be performed, e.g., by heating the substrate to temperatures in the range of 1000° C.-1200° C., to activate the dopants.

Figure 4:
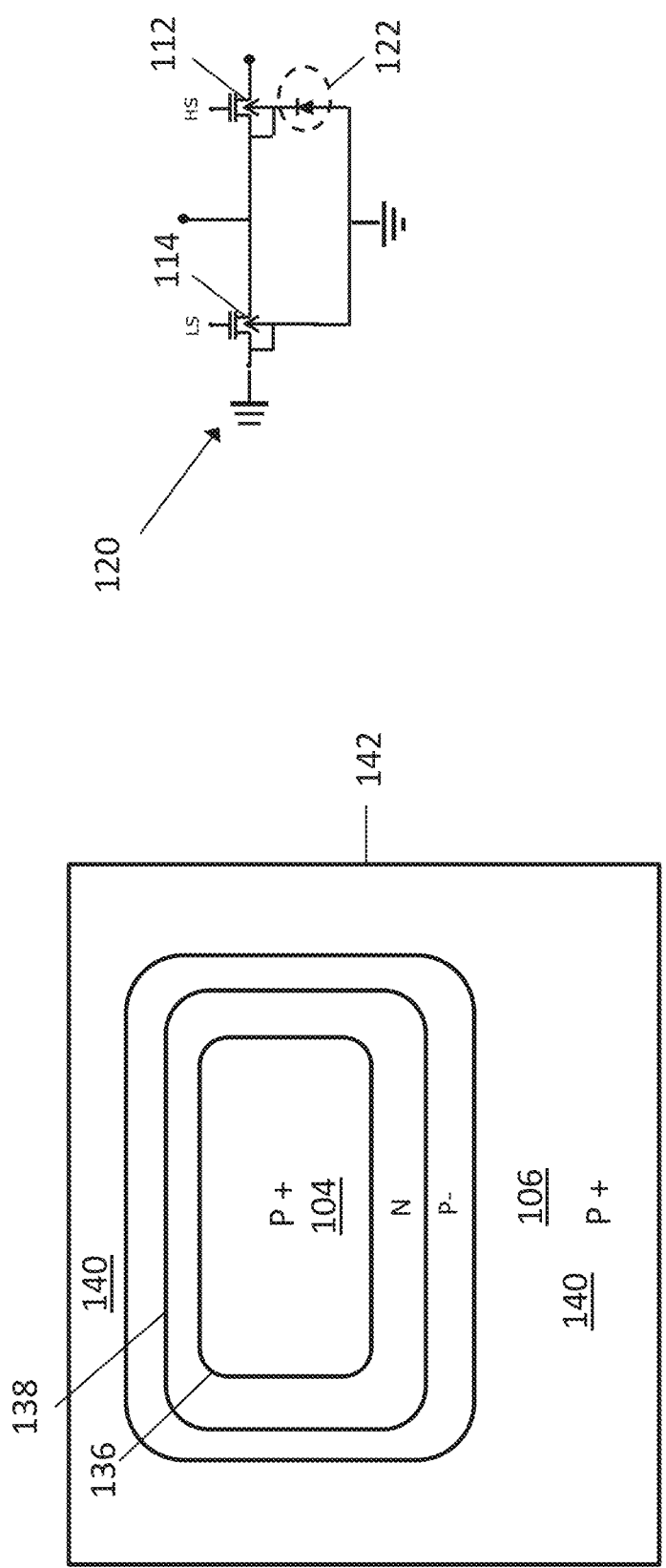
FIG. 4 illustrates a plan-view perspective of the pre-engineered substrate configuration of FIG. 3 in a single-phase implementation, according to an embodiment.

Referring to FIG. 4, a planar view of a one-phase die-site 142 in the pre-engineered base substrate 102 is depicted, according to an embodiment. This die-site 142 configuration can be repeated multiple times across a single semiconductor wafer. In this example, the first doped well 136 is on one side of the die-site 142, with the second doped well 138 surrounding it. This forms the first device area 104. The third doped well 140 forms a large region on the other side of the die-side, which provides the second device region 106. The region between the second doped well 138 and the chip edge forms the edge termination region 134.

Figure 5:
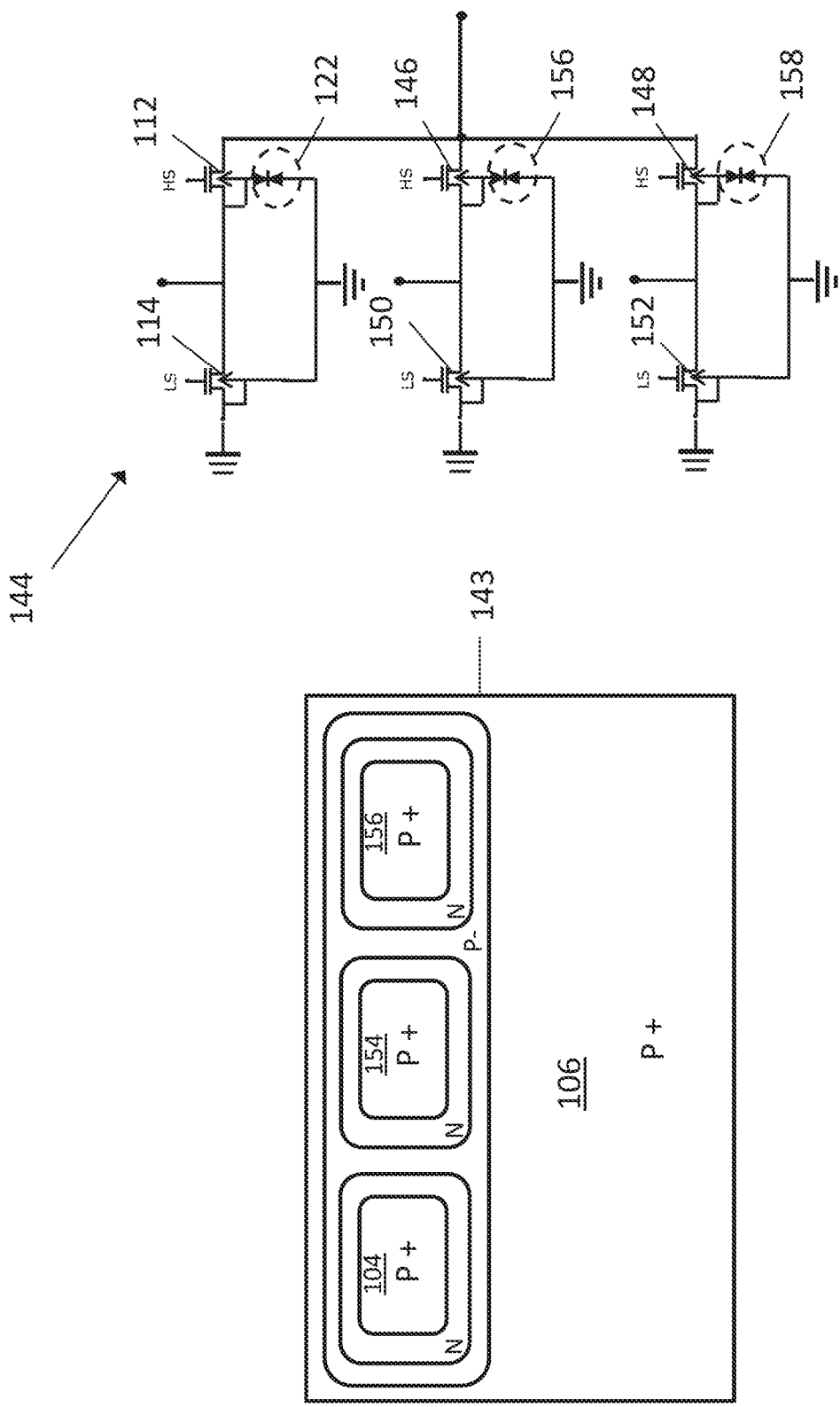
FIG. 5 illustrates a plan-view perspective of the pre-engineered substrate configuration of FIG. 3 in a three-phase implementation, according to an embodiment.

Referring to FIG. 5, a planar view of a three-phase die-site 143 in the pre-engineered base substrate 102 is depicted, according to another embodiment. This die-site 143 configuration can be repeated multiple times across a single semiconductor wafer. In this case, the die-site 143 is pre-engineered to accommodate a three phase half-bridge circuit 144, which is configured to provide power conversion in three different phases. The three phase half-bridge circuit 144 includes the first and second high-electron mobility transistors 112, 114 connected in the same manner as previously described, and additionally includes third, fourth, fifth and sixth high-electron mobility transistors 146, 148, 150 and 152. The third and fifth high-electron mobility transistors 146, 150 are connected in series with the source terminal of the third high-electron mobility transistor 146 connected to the drain terminal of the fifth high-electron mobility transistor 150. The fourth and sixth high-electron mobility transistors 148, 152 are connected in series with the source terminal of the fourth high-electron mobility transistor 148 connected to the drain terminal of the sixth high-electron mobility transistor 152.

The pre-engineered base substrate 102 includes third and fourth device areas 154, 156 that are each electrically isolated from the second device area 106 and each extend to the upper surface 116. The third device area 154 is electrically isolated from the subjacent intrinsically doped region of the base substrate 102 by a second two-way voltage blocking device 156, and the fourth device area 156 is electrically isolated from the subjacent intrinsically doped region of the base substrate 102 by a third two-way voltage blocking device 158. This configuration is obtained by forming opposing p-n junctions within the base substrate 102 in the same manner as the first device area 104.

In an embodiment, a third region of type III-V semiconductor material (not shown) is formed on the upper surface 116 of the base substrate 102 over the third device area 154 and a fourth region of type III-V semiconductor material (not shown) is formed on the upper surface 116 of the base substrate 102 over the fourth device area 156. The third and fourth regions of type III-V semiconductor material may be laterally electrically insulated from one another and from the second region of type III-V semiconductor material 110, e.g., by a. dielectric region similar to the dielectric region 118 shown in FIG. 1. The third high-electron mobility transistor 146 is integrally formed in the third region of type III-V semiconductor material and fourth high-electron mobility transistor 158 is formed in the fourth region of type III-V semiconductor material. Moreover, the fifth and sixth high-electron mobility transistors 150, 152 are integrally formed in the second region of type III-V semiconductor material 110. In each case, the device may have the same basic configuration as described in FIG. 2.

The pre-engineered base substrate 102 of FIG. 5 can be formed by the same processing techniques as described with reference to the pre-engineered base substrate 102 of FIG. 4, wherein the doped regions of the second and third device areas 154, 156 are formed by the same implantation steps used to form the first device area 104. The third and fourth high-electron mobility transistors 156, 158 can include a source-substrate connection by connecting a substrate contact 214 to the third and fourth device areas 154, 156, respectively, in the previously described manner. Meanwhile, the fifth and sixth high-electron mobility transistors 150, 152 can be source-connected to the second device region 106.

Figure 6:
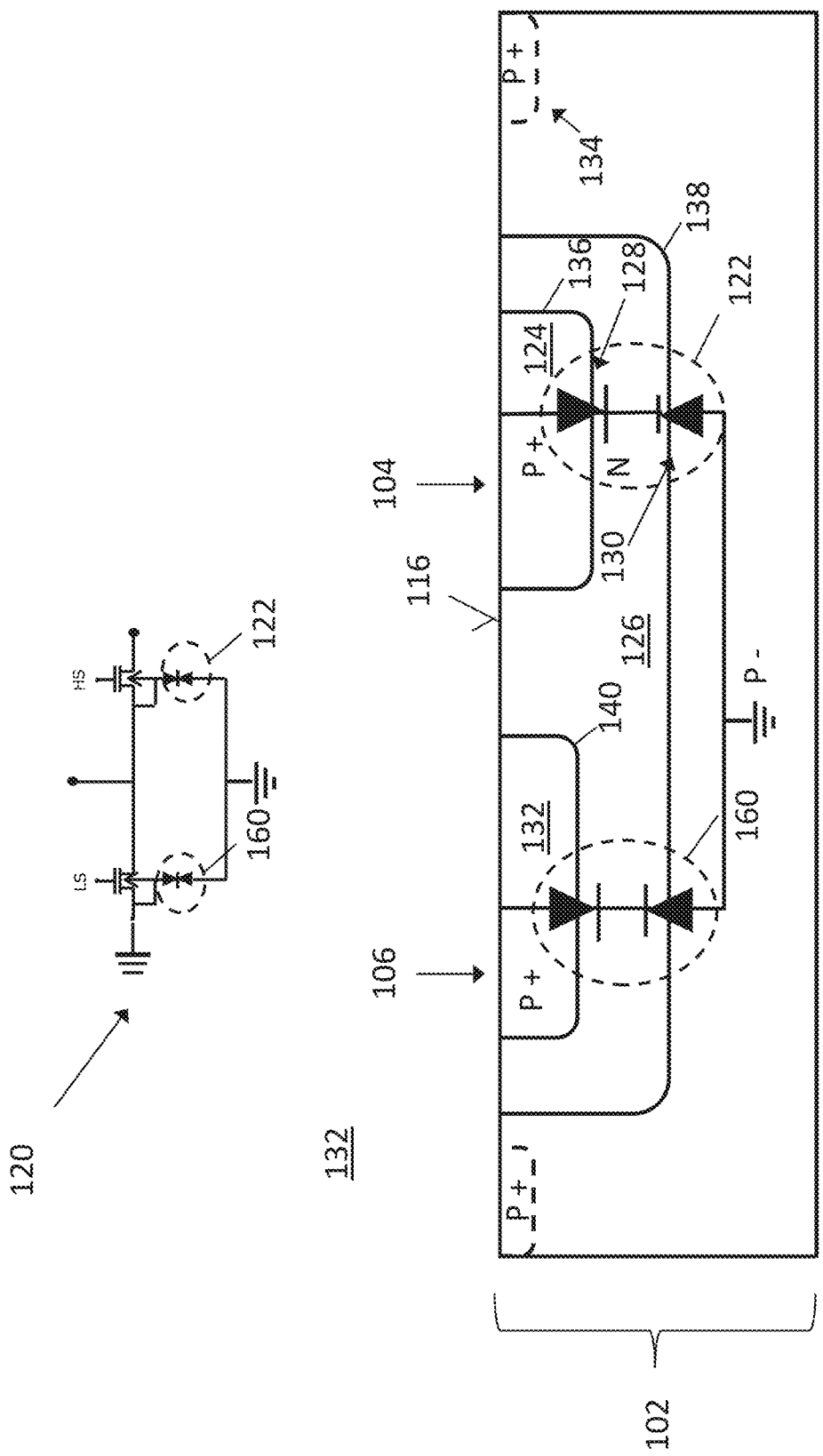
FIG. 6 illustrates a cross-sectional perspective of a pre-engineered substrate having electrically isolated device areas, according to an embodiment.

Referring to FIGS. 6-7, a pre-engineered base substrate 102 is depicted, according to another embodiment. In this embodiment, the second doped region 126 separates the third doped region 132 from the subjacent intrinsically doped region of the base substrate 102. Hence, a fourth two-way voltage blocking device 160 is formed between the second device area 106 and the subjacent intrinsically doped region. This configuration is obtained by forming the second doped well 138 to completely surround the third doped well 140.

FIGS. 7A and 7B respectively illustrate one-phase and three-phase die-site configurations 142, 143 for the pre-engineered base substrate 102 of FIG. 6. Similar to the previously described embodiment, the n doped regions for each die site can be formed by the first masked implantation step, and the p+ doped regions for each die site can be formed by the second masked implantation step.

Figure 8:
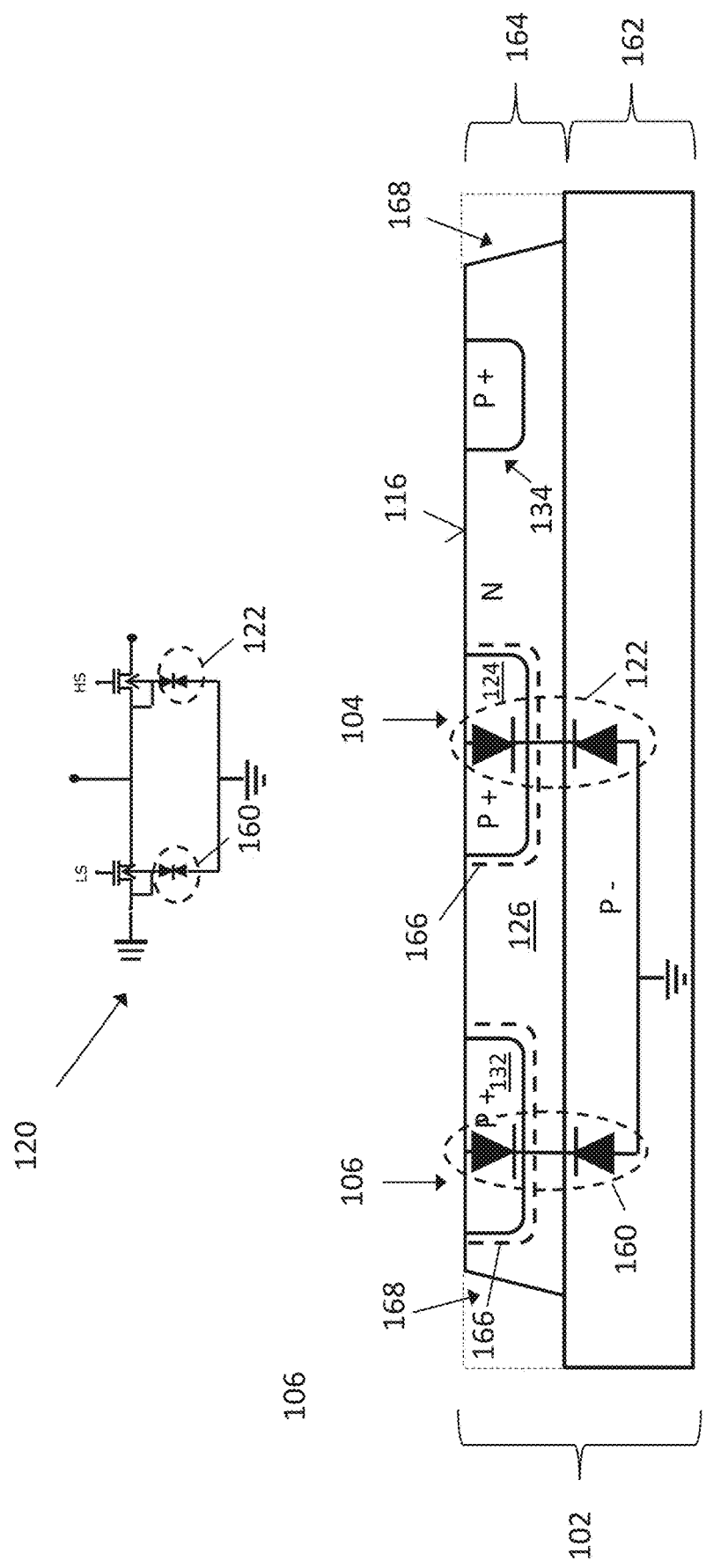
FIG. 8 illustrates a cross-sectional perspective of a pre-engineered substrate having electrically isolated device areas, according to an embodiment.

Referring to FIG. 8, pre-engineered base substrate 102 is depicted, according to another embodiment. In this example, the pre-engineered base substrate 102 is formed by a combination of epitaxy and masked implantation steps. According to this embodiment, a substantially undisturbed wafer 162 with an intrinsic dopant concentration of the first conductivity type is provided. The substantially undisturbed wafer 162 can be a bulk silicon wafer, for example. Subsequently, a first epitaxial layer 164 of the second conductivity type is formed on an upper surface of the substantially undisturbed wafer. This first epitaxial layer 164 provides the second doped region 126 of the pre-engineered base substrate 102. The epitaxy process for forming the first epitaxial layer 164 may be controlled to produce the previously described dopant characteristics of the second doped region 126. Subsequently, the first and third doped regions 124, 132 are formed in the first epitaxial layer 164. This may be done by a masked dopant implantation technique similar to the ones previously described. Additionally, the edge termination region 134 and a trench isolation 168 may be formed in the first epitaxial layer 134. The trench isolation may be formed around the outer perimeter of the device and may be filled with an insulating material. The resulting device includes the first and second device areas 104, 106, which are electrically isolated from the subjacent intrinsically doped region of the base substrate 102 (the wafer 162 in this example) by the first and fourth two-way voltage blocking devices 122, 160 in a similar manner as previously described. Hence, this embodiment allows for the formation of the isolated first and second device area 104, 106 in the base 102 substrate by performing only one epitaxial deposition step and one masked implantation step.

Optionally, the pre-engineered base substrate 102 may include buffer regions 166 around the first and third doped region 124, 132. The buffer regions 166 are second conductivity type regions with a higher dopant concentration than the second doped region 126. For example, in one embodiment, the second doped region 126 has a dopant concentration of about $5 \times 10^{13}$ dopant atoms/cm$^3$ and the buffer regions 166 have a dopant concentration in the range of $10^{14}$ dopant atoms/cm$^3$. The buffer regions 166 can be formed using the same implant mask used to form the first and third doped regions 124, 132, wherein the implant energy for the dopants of the buffer regions 166 is controlled penetrate deeper into the base substrate 102. The buffer regions 166 prevent punch-through, allowing for a shorter separation distance between the first and second device areas 104, 106 and a reduction in thickness of the first epitaxial layer 164.

Figure 9:
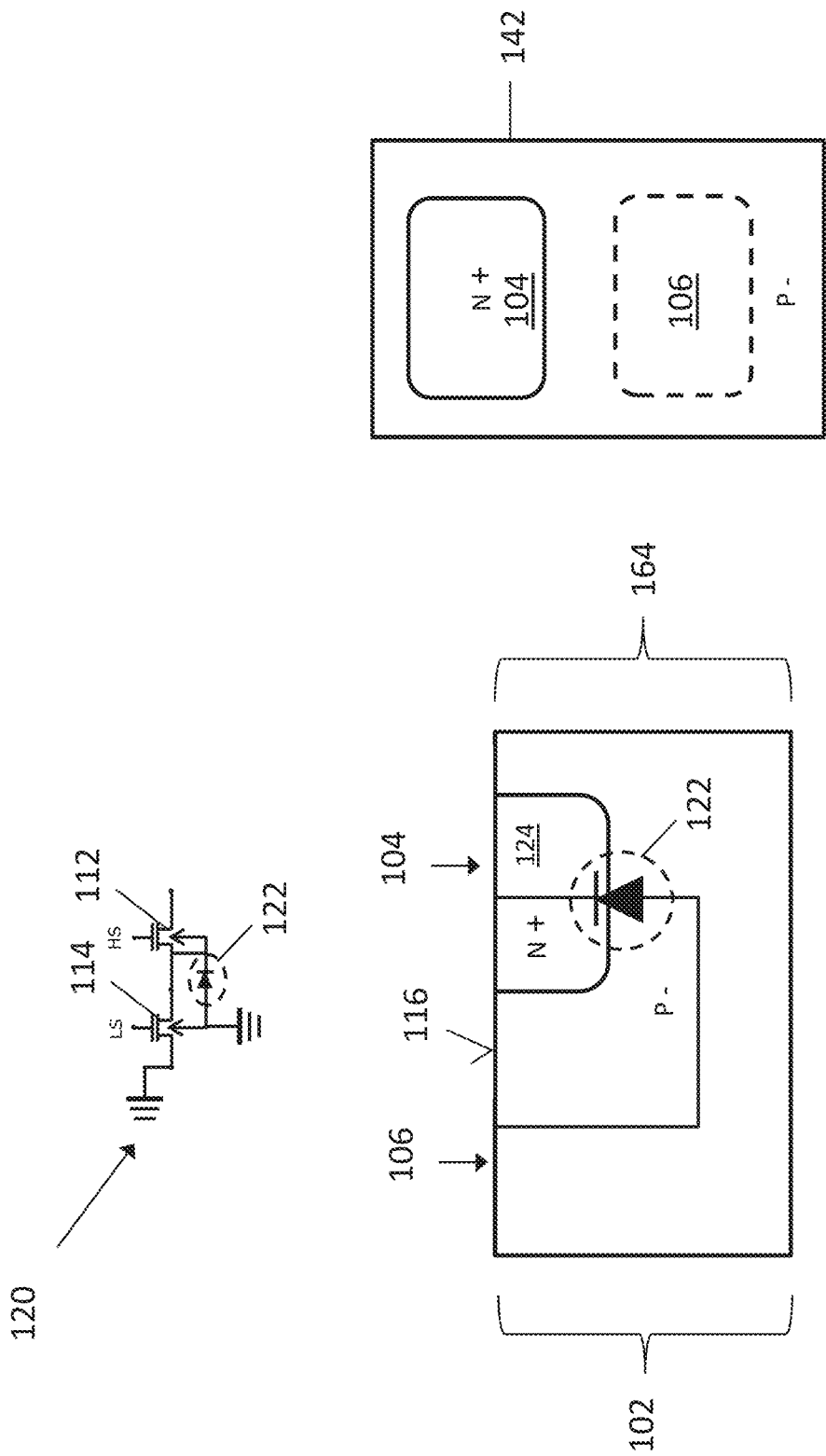
FIG. 9 illustrates a cross-sectional perspective of a pre-engineered substrate having electrically isolated device areas, according to an embodiment.

Referring to FIG. 9, a pre-engineered base substrate 102 is depicted, according to another embodiment. In this example, the base substrate 102 includes only the first doped region 124, which is formed directly in a substantially undisturbed wafer 164 with an intrinsic dopant concentration of the first conductivity type. Hence, the first doped region 124 directly interfaces with the intrinsically doped semiconductor material. As a result, the first doped region 124 is electrically isolated subjacent intrinsically doped region of the base substrate 102 by a one-way voltage blocking device 122, which is provided by the p-n junction between the first doped region 124 and the subjacent intrinsically doped region of the base substrate 102. Thus, the above discussed reverse recovery benefits of a two-way voltage blocking device are forfeited in this embodiment. However, this embodiment has the advantage of minimal processing steps and hence lower production cost. The pre-engineered base substrate 102 of FIG. 9 can be provided by performing only a single masked implantation step on a substantially undisturbed wafer to form the first doped region 124 as a doped well. As shown in the plan-view perspective of FIG. 9B, the second device region 106 can be provided by a surface region of the base substrate 102 which has the intrinsic dopant concentration.

Figure 10:
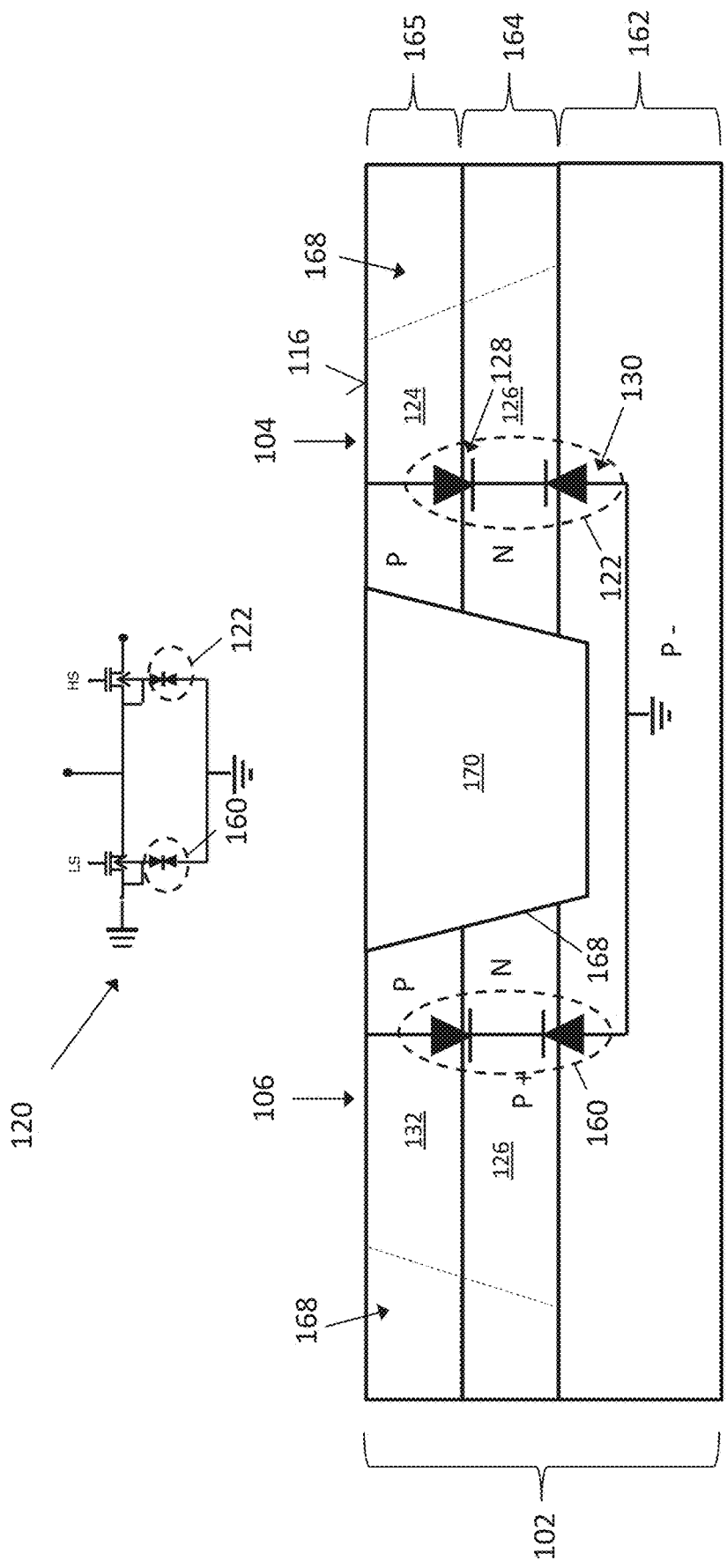
FIG. 10 illustrates a cross-sectional perspective of a pre-engineered substrate having electrically isolated device areas, according to an embodiment.

Referring to FIG. 10, a pre-engineered base substrate 102 is depicted, according to another embodiment. According to this technique, isolated device regions may be produced without forming any masks on the substrate. Instead, an isolation trench 168 is used to electrically isolate blanket regions of doped semiconductor material.

In one embodiment, both of the first and second doped regions 124, 132 are produced by epitaxial growth. According to this technique, a substantially undisturbed wafer 162 with an intrinsic dopant concentration of the first conductivity type is provided. Subsequently, a first epitaxial layer 164 of type IV semiconductor material (e.g., silicon) is formed on an upper surface of the substantially undisturbed wafer 162. The first epitaxial layer 164 provides the second doped region 126 of the pre-engineered base substrate 102. The epitaxy process for forming the first epitaxial layer 164 may be controlled to produce the previously described dopant characteristics of the second doped region 126. Subsequently, a second epitaxial layer 165 of type IV semiconductor material (e.g., silicon) is formed on the first epitaxial layer 164. The second epitaxial layer 165 provides the first and third doped regions 124, 132 of the pre-engineered base substrate 102. The epitaxy process for forming the second epitaxial layer 165 may be controlled to produce the previously described dopant characteristics of the first and third doped regions 124, 132.

An isolation trench 168 is formed in the first and second epitaxial layers 164, 165. The isolation trench 168 extends through the first and second epitaxial layers 164, 165 and reaches the subjacent intrinsically doped region of the base substrate 102. The isolation trench 168 may be formed using known etching techniques, e.g., reactive ion etching, wet chemical etching, etc. The isolation trench 168 is laterally disposed between the first and second device areas 104, 106, and is configured to provide lateral electrical isolation between these regions. To this end, the isolation trench 168 may be filled with a dielectric region 170 of electrically insulating material, e.g., silicon dioxide, silicon nitride, etc.

Figure 12:
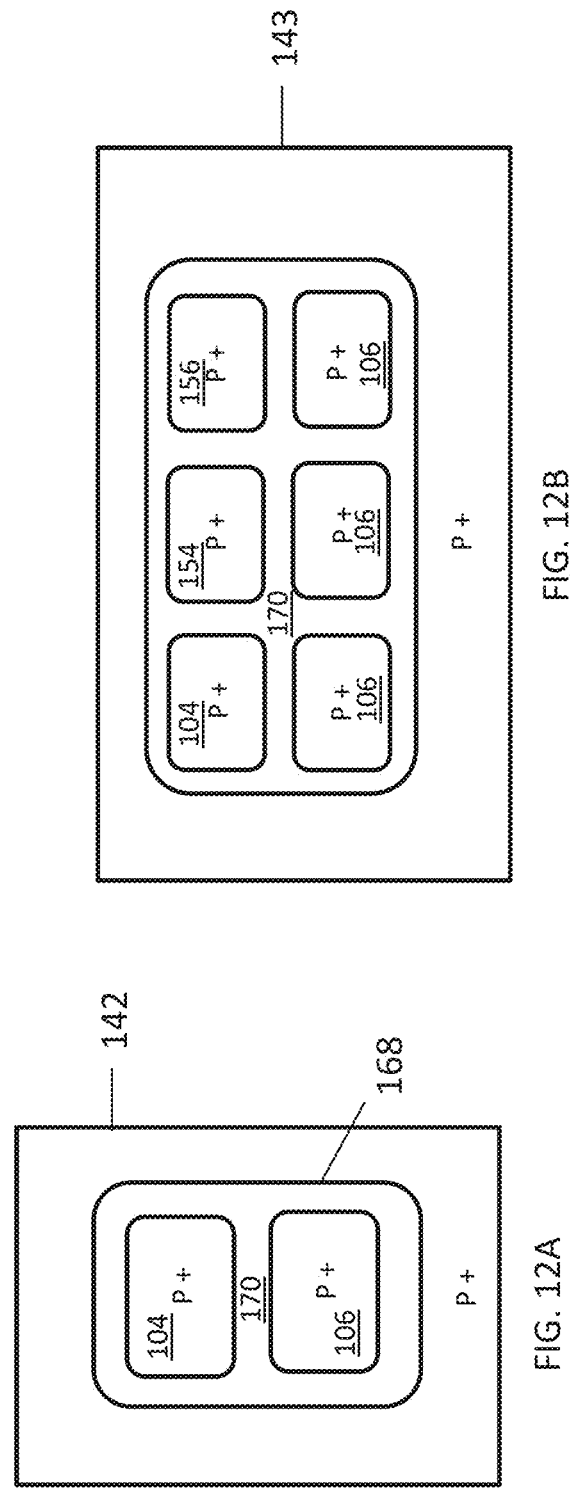
FIG. 12, which includes

The isolation trench 168 forms an enclosed loop around the first device area 104 (e.g., as shown in FIGS. 11 and 12). The first device area 104 is formed from a section of the second epitaxial layer 165 that is enclosed by the isolation trench 168. This section of the second epitaxial layer 165 is electrically isolated from the subjacent intrinsically doped region of the base substrate 102 by a section of the first epitaxial layer 164 that is enclosed by the isolation trench 168. The combination of the first and second epitaxial layers 164, 165 and the isolation trench 168 produces the first two-way voltage blocking device 122 that electrically isolates the first device area 104 from the subjacent intrinsically doped region of the base substrate 102. The first two-way voltage blocking device 122 includes a first p-n junction diode 128 between the first and second epitaxial layers 164, 165 and a second p-n junction diode 130 between the first epitaxial layer 164 and the intrinsically doped region of the base substrate 102.

In another embodiment, the isolation trench 168 may be formed in blanket implanted layers to provide correspondingly isolated first and second device areas 104, 106. According to this technique, two opposite conductivity type blanket layers are formed on top of one another in a substantially undisturbed wafer 162. No masks are used so that the dopants uniformly penetrate the substantially undisturbed wafer 162. The dopant energy is controlled such that the second conductivity type dopants penetrate deeper than the first conductivity type dopants, hence producing two blanket layers with a similar arrangement as the first and second epitaxial layers 164, 165. The isolation trench 168 can be formed in a similar manner to surround and electrically isolate these blanket layers.

Optionally, further isolation trenches 168 may be formed at the outer perimeter of the substrate. These further isolation trenches 168 may be filled with an electrically insulating material and configured to provide edge termination regions.

FIGS. 11 and 12 illustrate two possible configurations of the isolation trench 168. In the embodiment of FIG. 11, the isolation trench 168 is formed only around the first device area 104. In that case, the second device area 106 corresponds to a remaining portion of the second epitaxial layer 165 that is outside of the enclosure of the isolation trench 168. In the embodiment of FIG. 12, the isolation trench 168 encloses two sections of the first and second epitaxial layers 164, 165 in the case of a one-phase implementation or six sections of the first and second epitaxial layers 164, 165 in the case of a three-phase implementation. Hence, this configuration provides an electrically isolated device area for each device, thus offering greater layout flexibility.

Figure 13:
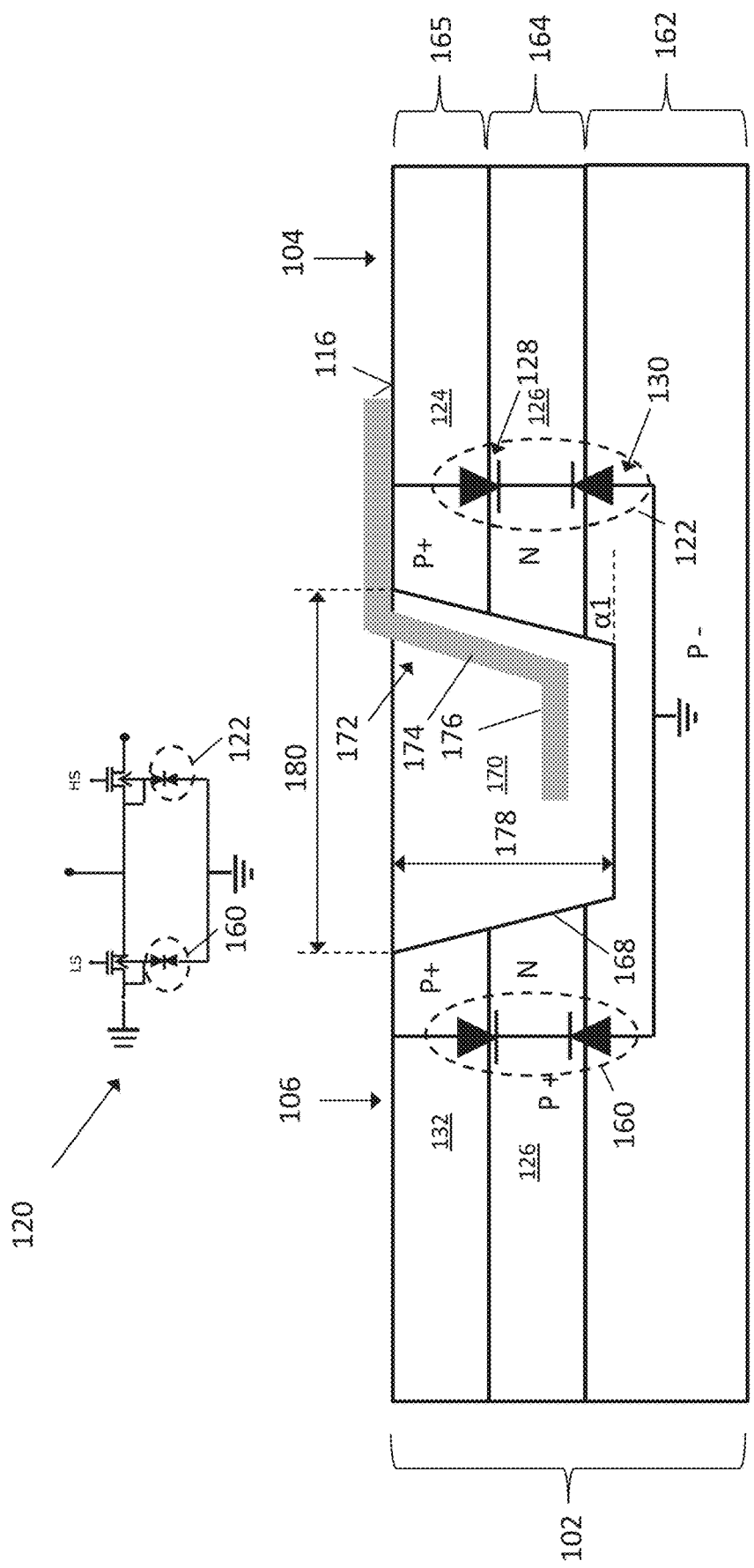
FIG. 13 illustrates a cross-sectional perspective of a pre-engineered substrate having electrically isolated device areas, according to an embodiment.

Referring to FIG. 13, a pre-engineered base substrate 102 is depicted, according to another embodiment. In this example, the base substrate 102 includes the first and second epitaxial layers 164, 165 and the isolation trench 168 as previously discussed, and additionally includes a field plate 172. The field plate 172 includes an electrically conductive material, e.g., polysilicon or a conductive metal such as copper, aluminum, alloys thereof, etc. The field plate 172 includes a first section 174 that is substantially parallel to a sidewall of the isolation trench 168 and a second section 176 that is substantially parallel to a bottom of the isolation trench 168. The first section 174 is separated from first sidewall by a region of dielectric material, e.g., in the range of 1-2 µm thick, and the second section is separated bottom of the isolation trench 168 by a region of dielectric material, e.g., in the range of 1-2 µm thick.

In the fully formed device, the field plate 172 may be connected to a device node, such as a gate or source terminal. In an embodiment, the field plate 172 is connected to the source terminal of the first high-electron mobility transistor 112. In this configuration, the field plate 172 improves the breakdown voltage of the first high-electron mobility transistor 112 by providing compensatory fields in the intrinsic substrate portion, thereby mitigating the above described substrate back gating effect.

The inventors have investigated the physical parameters of the isolation trench 168 and the field plate 172 structure and observed that performance benefits can be obtained by tailoring these physical parameters. Specifically, the parameters of trench depth, trench width, angle of sidewalls of the trench, length of the first section 174 of the field plate 172, and the length of second section 176 of the field plate 172, all contribute to the breakdown voltage of the device to which the field plate 172 is connected. Generally speaking, beneficial breakdown voltage performance of greater than 600V was observed for an isolation trench 168 having a depth 178 in the range of 4-8 µm, a width 180 in the range of 40-60 µm, trench sidewall angles α1 in the range of 30 degrees to 70 degrees, and a field plate 172 with a length of the first section 174 in the range of 1-2 µm and length of the second section 176 in the range of 15-25 µm. In one particular example, an advantageously high breakdown voltage of approximately 919 V was observed for an isolation trench 168 having a depth 178 of 7 µm, a width 180 of 50 of µm, a trench sidewall angle α1 of 45 degrees, and a field plate 172 with a length of the first section 174 of 1.6 µm and length of the second section 176 of 18.4 µm.

Tailoring the dimensions of the field plate 172 and the isolation trench 168 may involve tradeoffs in the behavior of the base substrate 102 and/or the devices formed thereon. One particular relationship that was observed is a tradeoff between the breakdown voltage of the device connected to the field plate 172 (e.g., the first high-electron mobility transistor 112) and the substrate voltage of the device on the opposite side of the isolation trench 176 (e.g., the second high-electron mobility transistor 114). As the length of the second section 176 is increased, the breakdown voltage of the device connected to the field plate 172 increases in a substantially linear relationship. However, increasing the length of the second section 176 also causes a substantially linear in the substrate voltage in the device on the opposite side of the isolation trench 176. In a half-bridge configuration, a non-zero voltage in the substrate of the low side switch does not necessarily cause failure when the low side switch is off. However, at sufficiently high voltages, device failure may occur. It was observed that when the length of the length of the second section 176 is about half of the width of the trench, a beneficially high breakdown voltage for the high-side switch of over 900 V was observed while the substrate voltage for the low side switch remains within benign ranges of about 200 V.

Figure 14:
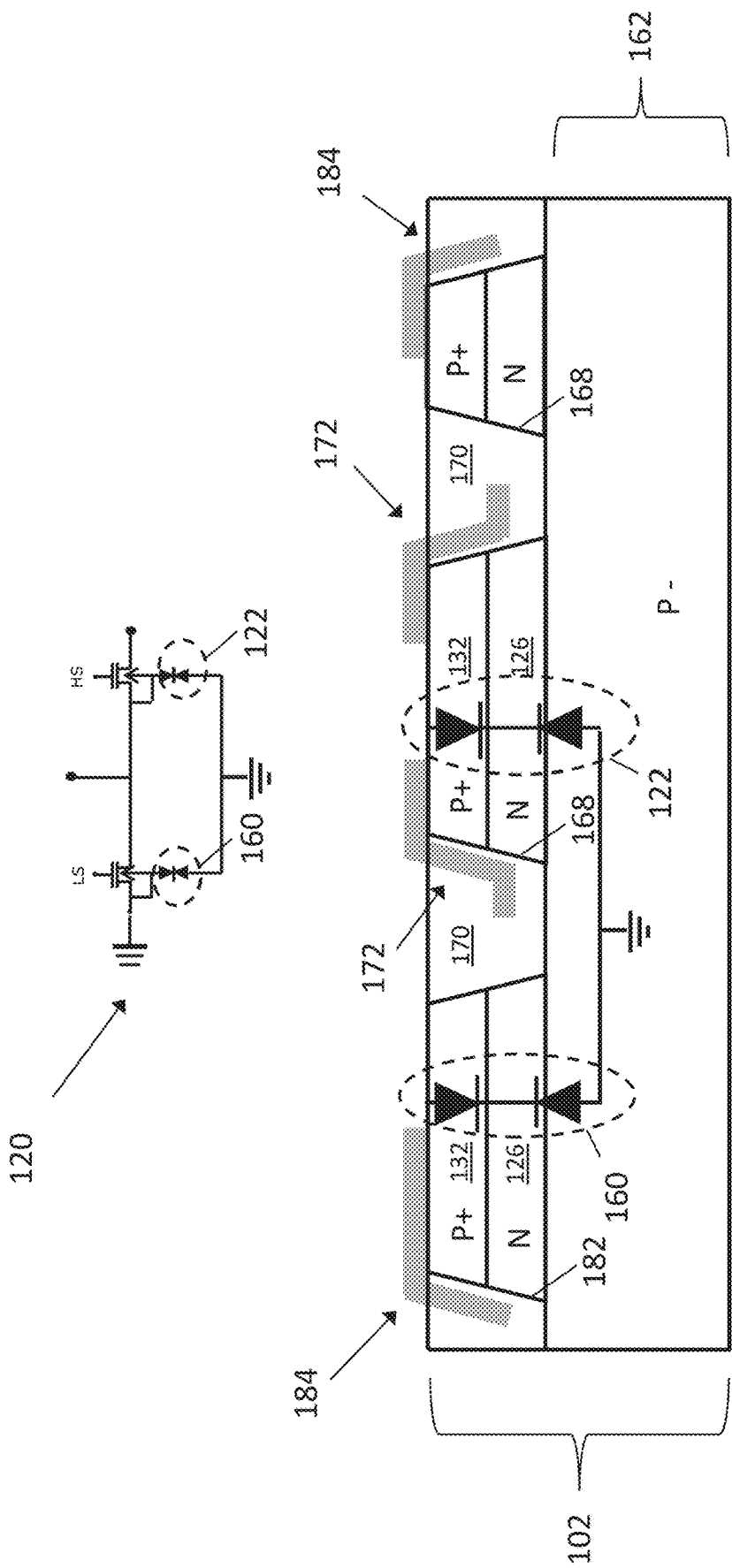
FIG. 14 illustrates a cross-sectional perspective of a pre-engineered substrate having electrically isolated device areas, according to an embodiment.

Referring to FIGS. 14 and 15, a pre-engineered base substrate 102 is depicted, according to another embodiment. In this example, the field plate 172 forms a complete loop along a perimeter of the isolation trench 168. The base substrate 102 may optionally include a second trench 182 formed around a perimeter of the chip with a second field plate 184 formed in this trench. The second field plate 184 is an optional structure that can be configured as an edge termination structure.

Figure 16:
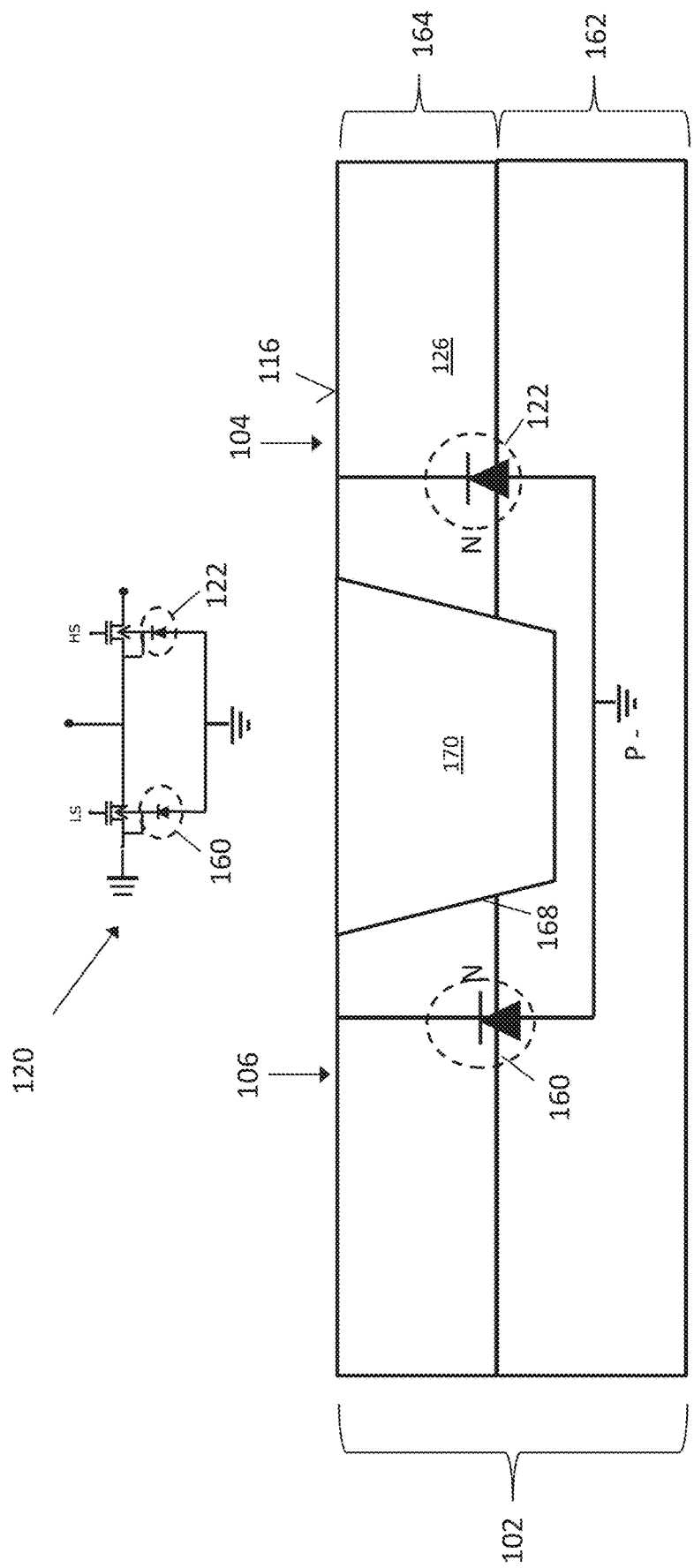
FIG. 16 illustrates a cross-sectional perspective of a pre-engineered substrate having electrically isolated device areas, according to an embodiment.

Referring to FIG. 16, a pre-engineered base substrate 102 is depicted, according to another embodiment. In this example, the base substrate 102 includes only a single first epitaxial layer 164 formed on an upper surface of the substantially undisturbed wafer 162. This first epitaxial layer 164 provides the second doped region 126 of the pre-engineered base substrate 102. The device includes an isolation trench 168 formed in a similar manner as previously described. As a result, the first and second device areas 104, 106 are each isolated from the subjacent intrinsically doped region by a one-way voltage blocking device 122. One benefit of this embodiment is reduced cost and complexity, as only one epitaxial step is required.

Figure 17:
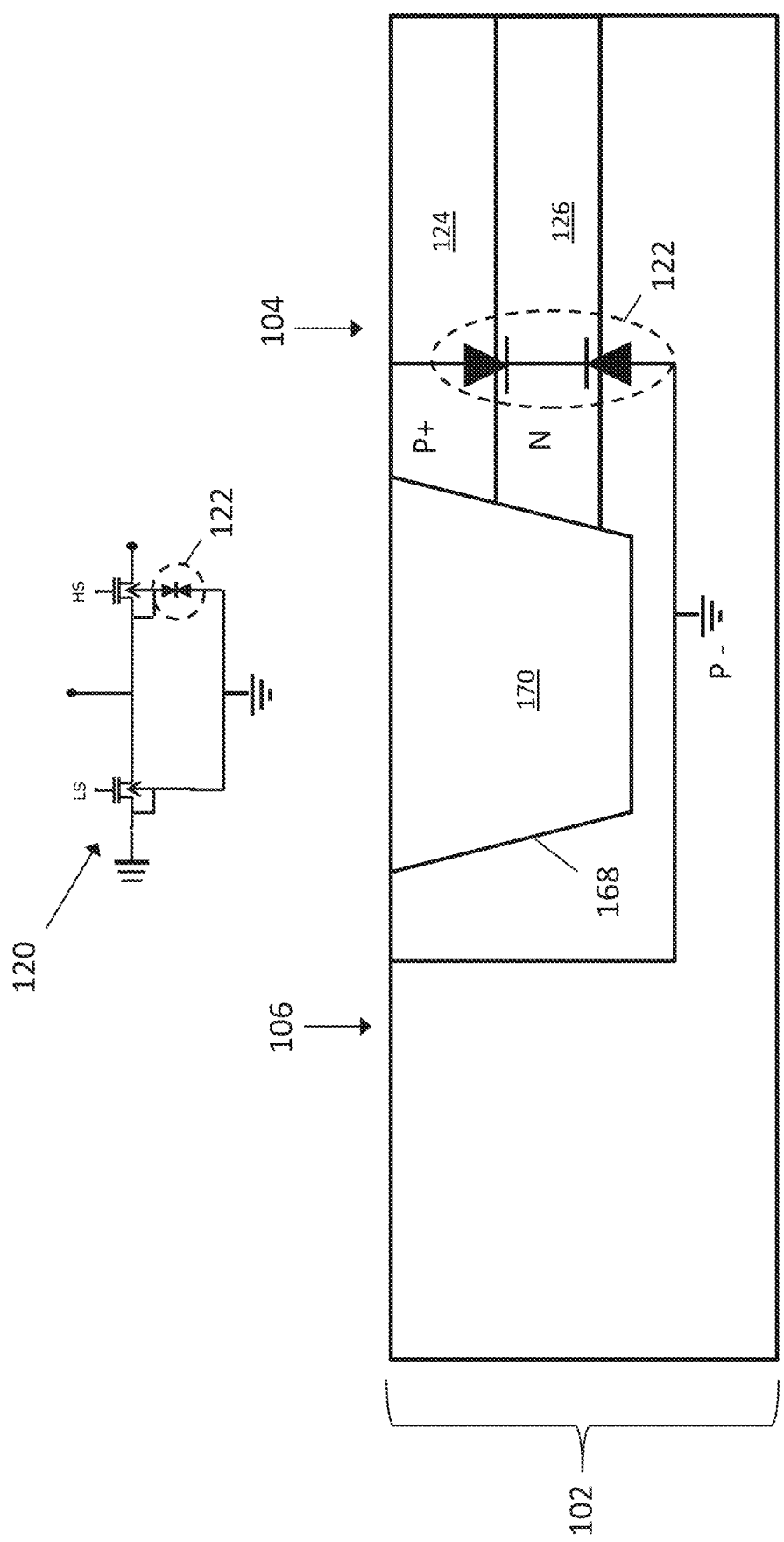
FIG. 17 illustrates a cross-sectional perspective of a pre-engineered substrate having electrically isolated device areas, according to an embodiment.

Referring to FIG. 17, a pre-engineered base substrate 102 is depicted, according to another embodiment. In this embodiment, the first and second doped regions 124, 126 are provided only within the enclosed region of the isolation trench 168. The first and second doped regions 124, 126 may be formed implantation processes according to the techniques described above. As a result, the first device area 104 is electrically isolated from the subjacent intrinsically doped region by a two-way voltage blocking device 122.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

In this specification, n-doped is referred to as first conductivity type while n-doped is referred to as second conductivity type. Alternatively, the semiconductor device 100s can be formed with opposite doping relations so that the first conductivity type can be n-doped and the second conductivity type can be p-doped. Furthermore, some figures illustrate relative doping concentrations by indicating "−" or "+" next to the conductivity type. For example, "n-" means a doping concentration which is less than the doping concentration of an "n⁻"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different n⁺-doping regions can have different absolute doping concentrations. The same applies, for example, to an n⁺-doping and a p⁺-doping region.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
    providing a base substrate of type IV semiconductor material comprising a rear surface and an upper surface opposite the rear surface;
    forming first and second device areas in the base substrate that are electrically isolated from one another and each extend to the upper surface;
    forming a first region of type III-V semiconductor material on the base substrate over the first device area;
    forming a second region of type III-V semiconductor material on the base substrate over the second device area, the second region of type III-V semiconductor material being laterally electrically insulated from the first region of type III-V semiconductor material;
    integrally forming a first high-electron mobility transistor in the first region of type III-V semiconductor material;
    integrally forming a second high-electron mobility transistor in the second region of type III-V semiconductor material, the first and second high-electron mobility transistors each comprising source and drain terminals and are each configured to control a conductive connection between the respective source and drain terminals;
    connecting the first and second high-electron mobility transistors in series with the source terminal of the first high-electron mobility transistor connected to the drain terminal of the second high-electron mobility transistor;
    connecting the source terminal of the first high-electron mobility transistor high-electron mobility transistor electrically to the electrically to the first device area; and
    forming a voltage blocking device that electrically isolates the first device area from a subjacent region of the base substrate,
    wherein the voltage blocking device is formed by no more than two masked dopant implantation steps.

2. The method of claim 1, wherein the base substrate has an intrinsic dopant concentration of a first conductivity type, and wherein forming the voltage blocking device comprises:
    performing a first masked implantation step that forms a second doped well in a region of the base substrate, the second doped well having a second conductivity type that is opposite the first conductivity type.

3. The method of claim 2, wherein forming the voltage blocking device further comprises:
    performing a second masked implantation step that forms a first doped well within the second doped well, the first doped well having the first conductivity type and having a higher dopant concentration than the region of the base substrate, and
    wherein the first and second masked implantation steps form a first two-way voltage blocking device that is interposed between the first device area and the subjacent region of the base substrate.

4. A method of forming a semiconductor device, comprising:
    providing a base substrate of type IV semiconductor material comprising a rear surface and an upper surface opposite the rear surface;
    forming first and second device areas in the base substrate that are electrically isolated from one another and each extend to the upper surface;
    forming a first region of type III-V semiconductor material on the base substrate over the first device area;
    forming a second region of type III-V semiconductor material on the base substrate over the second device area, the second region of type III-V semiconductor material being laterally electrically insulated from the first region of type III-V semiconductor material;
    integrally forming a first high-electron mobility transistor in the first region of type III-V semiconductor material,
    integrally forming a second high-electron mobility transistor in the second region of type III-V semiconductor material, the first and second high-electron mobility transistors each comprising source and drain terminals and are each configured to control a conductive connection between the respective source and drain terminals;

connecting the first and second high-electron mobility transistors in series with the source terminal of the first high-electron mobility transistor connected to the drain terminal of the second high-electron mobility transistor;

connecting the source terminal of the first high-electron mobility transistor electrically to the first device area;

forming one or more epitaxial layers on a region of the base substrate; and forming an isolation trench between the first and second device areas, and wherein the one or more epitaxial layers form a voltage blocking device that electrically isolates the first device area from the region of the base substrate.

5. The method of claim 4, wherein forming the one or more epitaxial layers comprises:

epitaxially forming a first epitaxial layer of a second conductivity type directly on the region of the base substrate, the second conductivity type being opposite the first conductivity type, and wherein the voltage blocking device comprises a second p-n junction diode between the first epitaxial layer and the region of the base substrate.

6. The method of claim 5, wherein forming the one or more epitaxial layers further comprises:

epitaxially forming a second epitaxial layer of the first conductivity type on the first epitaxial layer, the second epitaxial layer having a higher dopant concentration than the region of the base substrate, and wherein the voltage blocking device further comprises a first p-n junction diode between the first and second epitaxial layers.

7. The method of claim 6, wherein the isolation trench is formed to extend through the first and second epitaxial layers, and wherein the first device area is fully surrounded by the isolation trench.

* * * * *

UNITED STATES PATENT AND TRADEMARK OFFICE
CERTIFICATE OF CORRECTION

PATENT NO. : 11,251,294 B2  
APPLICATION NO. : 16/828104  
DATED : February 15, 2022  
INVENTOR(S) : Kim et al.

Page 1 of 1

It is certified that error appears in the above-identified patent and that said Letters Patent is hereby corrected as shown below:

In the Claims

Column 18, Lines 18-19 (Claim 1, Lines 31-32) please change "transistor high-electron mobility transistor electrically to the electrically" to -- transistor electrically --

Signed and Sealed this
Twenty-sixth Day of April, 2022

Katherine Kelly Vidal
*Director of the United States Patent and Trademark Office*